United States Patent
Gorrell

(10) Patent No.: US 8,188,431 B2
(45) Date of Patent: *May 29, 2012

(54) INTEGRATION OF VACUUM MICROELECTRONIC DEVICE WITH INTEGRATED CIRCUIT

(76) Inventor: Jonathan Gorrell, Gainesville, FL (US)

(*) Notice: Subject to any disclaimer, the term of this patent is extended or adjusted under 35 U.S.C. 154(b) by 1526 days.

This patent is subject to a terminal disclaimer.

(21) Appl. No.: 11/418,318

(22) Filed: May 5, 2006

(65) Prior Publication Data
US 2007/0259465 A1 Nov. 8, 2007

(51) Int. Cl.
*H01J 1/00* (2006.01)
*G01T 1/00* (2006.01)

(52) U.S. Cl. ............ 250/336.1; 250/202; 250/397; 438/26

(58) Field of Classification Search ............ 438/50, 438/64, 65, 24–29; 257/E25.004, E25.005, 257/E25.009, 80, 81, 82, E33.056, E21.499; 250/494.1, 400, 310, 399, 336.1, 397, 202
See application file for complete search history.

(56) References Cited

U.S. PATENT DOCUMENTS

| | | |
|---|---|---|
| 1,948,384 A | 2/1934 | Lawrence |
| 2,307,086 A | 1/1943 | Varian et al. |
| 2,431,396 A | 11/1947 | Hansell |
| 2,473,477 A | 6/1949 | Smith |
| 2,634,372 A | 4/1953 | Salisbury |
| 2,932,798 A | 4/1960 | Kerst et al. |
| 2,944,183 A | 7/1960 | Drexler |
| 2,966,611 A | 12/1960 | Sandstrom |
| 3,231,779 A | 1/1966 | White |
| 3,274,428 A | 9/1966 | Harris |
| 3,297,905 A | 1/1967 | Rockwell et al. |
| 3,315,117 A | 4/1967 | Udelson |
| 3,387,169 A | 6/1968 | Farney |
| 3,543,147 A | 11/1970 | Kovarik |
| 3,546,524 A | 12/1970 | Stark |
| 3,560,694 A | 2/1971 | White |
| 3,571,642 A | 3/1971 | Westcott |
| 3,586,899 A | 6/1971 | Fleisher |
| 3,761,828 A | 9/1973 | Pollard et al. |
| 3,886,399 A | 5/1975 | Symons |
| 3,923,568 A | 12/1975 | Bersin |

(Continued)

FOREIGN PATENT DOCUMENTS

EP  0237559 B1  12/1991

(Continued)

OTHER PUBLICATIONS

Brau et al., "Tribute to John E Walsh", Nuclear Instruments and Methods in Physics Research Section A. Accelerators, Spectrometers, Detectors and Associated Equipment, vol. 475, Issues 1-3, Dec. 21, 2001, pp. xiii-xiv.

(Continued)

*Primary Examiner* — Julio J Maldonado
(74) *Attorney, Agent, or Firm* — Davidson, Berquist, Jackson & Gowdey LLP

(57) ABSTRACT

A device includes an integrated circuit (IC) and at least one ultra-small resonant structure formed on said IC. At least the ultra-small resonant structure portion of the device is vacuum packaged. The ultra-small resonant structure portion of the device may be grounded or connected to a known electrical potential. The ultra-small resonant structure may be electrically connected to the underlying IC, or not.

46 Claims, 8 Drawing Sheets

U.S. PATENT DOCUMENTS

| | | | |
|---|---|---|---|
| 3,989,347 A | 11/1976 | Eschler | |
| 4,053,845 A | 10/1977 | Gould | |
| 4,269,672 A | 5/1981 | Inoue | |
| 4,282,436 A | 8/1981 | Kapetanakos | |
| 4,296,354 A | 10/1981 | Neubauer | |
| 4,450,554 A | 5/1984 | Steensma et al. | |
| 4,453,108 A | 6/1984 | Freeman, Jr. | |
| 4,482,779 A | 11/1984 | Anderson | |
| 4,528,659 A | 7/1985 | Jones, Jr. | |
| 4,589,107 A | 5/1986 | Middleton et al. | |
| 4,598,397 A | 7/1986 | Nelson et al. | |
| 4,630,262 A | 12/1986 | Callens et al. | |
| 4,652,703 A | 3/1987 | Lu et al. | |
| 4,661,783 A | 4/1987 | Gover et al. | |
| 4,704,583 A | 11/1987 | Gould | |
| 4,712,042 A | 12/1987 | Hamm | |
| 4,713,581 A | 12/1987 | Haimson | |
| 4,727,550 A | 2/1988 | Chang et al. | |
| 4,740,963 A | 4/1988 | Eckley | |
| 4,740,973 A | 4/1988 | Madey | |
| 4,746,201 A | 5/1988 | Gould | |
| 4,761,059 A | 8/1988 | Yeh et al. | |
| 4,782,485 A | 11/1988 | Gollub | |
| 4,789,945 A | 12/1988 | Niijima | |
| 4,806,859 A | 2/1989 | Hetrick | |
| 4,809,271 A | 2/1989 | Kondo et al. | |
| 4,813,040 A | 3/1989 | Futato | |
| 4,819,228 A | 4/1989 | Baran et al. | |
| 4,829,527 A | 5/1989 | Wortman et al. | |
| 4,838,021 A | 6/1989 | Beattie | |
| 4,841,538 A | 6/1989 | Yanabu et al. | |
| 4,864,131 A | 9/1989 | Rich et al. | |
| 4,866,704 A | 9/1989 | Bergman | |
| 4,866,732 A | 9/1989 | Carey et al. | |
| 4,873,715 A | 10/1989 | Shibata | |
| 4,887,265 A | 12/1989 | Felix | |
| 4,890,282 A | 12/1989 | Lambert et al. | |
| 4,898,022 A | 2/1990 | Yumoto et al. | |
| 4,912,705 A | 3/1990 | Paneth et al. | |
| 4,932,022 A | 6/1990 | Keeney et al. | |
| 4,981,371 A | 1/1991 | Gurak et al. | |
| 5,023,563 A | 6/1991 | Harvey et al. | |
| 5,036,513 A | 7/1991 | Greenblatt | |
| 5,065,425 A | 11/1991 | Lecomte et al. | |
| 5,113,141 A | 5/1992 | Swenson | |
| 5,121,385 A | 6/1992 | Tominaga et al. | |
| 5,127,001 A | 6/1992 | Steagall et al. | |
| 5,128,729 A | 7/1992 | Alonas et al. | |
| 5,130,985 A | 7/1992 | Kondo et al. | |
| 5,150,410 A | 9/1992 | Bertrand | |
| 5,155,726 A | 10/1992 | Spinney et al. | |
| 5,157,000 A | 10/1992 | Elkind et al. | |
| 5,163,118 A | 11/1992 | Lorenzo et al. | |
| 5,185,073 A | 2/1993 | Bindra | |
| 5,187,591 A | 2/1993 | Guy et al. | |
| 5,199,918 A | 4/1993 | Kumar | |
| 5,214,650 A | 5/1993 | Renner et al. | |
| 5,233,623 A | 8/1993 | Chang | |
| 5,235,248 A | 8/1993 | Clark et al. | |
| 5,262,656 A | 11/1993 | Blondeau et al. | |
| 5,263,043 A | 11/1993 | Walsh | |
| 5,268,693 A | 12/1993 | Walsh | |
| 5,268,788 A | 12/1993 | Fox et al. | |
| 5,282,197 A | 1/1994 | Kreitzer | |
| 5,283,819 A | 2/1994 | Glick et al. | |
| 5,293,175 A | 3/1994 | Hemmie et al. | |
| 5,302,240 A | 4/1994 | Hori et al. | |
| 5,305,312 A | 4/1994 | Fornek et al. | |
| 5,341,374 A | 8/1994 | Lewen et al. | |
| 5,354,709 A | 10/1994 | Lorenzo et al. | |
| 5,446,814 A | 8/1995 | Kuo et al. | |
| 5,485,277 A | 1/1996 | Foster | |
| 5,504,341 A | 4/1996 | Glavish | |
| 5,578,909 A | 11/1996 | Billen | |
| 5,604,352 A | 2/1997 | Schuetz | |
| 5,608,263 A | 3/1997 | Drayton et al. | |
| 5,637,966 A | 6/1997 | Umstadter et al. | |
| 5,663,971 A | 9/1997 | Carlsten | |
| 5,666,020 A | 9/1997 | Takemura | |
| 5,668,368 A | 9/1997 | Sakai et al. | |
| 5,705,443 A | 1/1998 | Stauf et al. | |
| 5,737,458 A | 4/1998 | Wojnarowski et al. | |
| 5,739,579 A * | 4/1998 | Chiang et al. | 257/635 |
| 5,744,919 A | 4/1998 | Mishin et al. | |
| 5,757,009 A | 5/1998 | Walstrom | |
| 5,767,013 A | 6/1998 | Park | |
| 5,780,970 A | 7/1998 | Singh et al. | |
| 5,790,585 A | 8/1998 | Walsh | |
| 5,811,943 A | 9/1998 | Mishin et al. | |
| 5,821,836 A | 10/1998 | Katehi et al. | |
| 5,821,902 A | 10/1998 | Keen | |
| 5,825,140 A | 10/1998 | Fujisawa | |
| 5,831,270 A | 11/1998 | Nakasuji | |
| 5,847,745 A | 12/1998 | Shimizu et al. | |
| 5,858,799 A | 1/1999 | Yee et al. | |
| 5,882,779 A * | 3/1999 | Lawandy | 428/323 |
| 5,889,449 A | 3/1999 | Fiedziuszko | |
| 5,889,797 A | 3/1999 | Nguyen | |
| 5,902,489 A | 5/1999 | Yasuda et al. | |
| 5,963,857 A | 10/1999 | Greywall | |
| 5,972,193 A | 10/1999 | Chou et al. | |
| 6,005,347 A | 12/1999 | Lee | |
| 6,008,496 A | 12/1999 | Winefordner et al. | |
| 6,008,577 A * | 12/1999 | Rasmussen et al. | 313/496 |
| 6,040,625 A | 3/2000 | Ip | |
| 6,060,833 A | 5/2000 | Velazco | |
| 6,080,529 A | 6/2000 | Ye et al. | |
| 6,117,784 A | 9/2000 | Uzoh | |
| 6,139,760 A | 10/2000 | Shim et al. | |
| 6,180,415 B1 | 1/2001 | Schultz et al. | |
| 6,195,199 B1 | 2/2001 | Yamada | |
| 6,210,555 B1 | 4/2001 | Taylor et al. | |
| 6,222,866 B1 | 4/2001 | Seko | |
| 6,278,239 B1 | 8/2001 | Caporaso et al. | |
| 6,281,769 B1 | 8/2001 | Fiedziuszko | |
| 6,297,511 B1 | 10/2001 | Syllaios et al. | |
| 6,301,041 B1 | 10/2001 | Yamada | |
| 6,303,014 B1 | 10/2001 | Taylor et al. | |
| 6,309,528 B1 | 10/2001 | Taylor et al. | |
| 6,316,876 B1 | 11/2001 | Tanabe | |
| 6,338,968 B1 | 1/2002 | Hefti | |
| 6,370,306 B1 | 4/2002 | Sato et al. | |
| 6,373,194 B1 | 4/2002 | Small | |
| 6,376,258 B2 | 4/2002 | Hefti | |
| 6,407,516 B1 | 6/2002 | Victor | |
| 6,441,298 B1 | 8/2002 | Thio | |
| 6,448,850 B1 | 9/2002 | Yamada | |
| 6,453,087 B2 | 9/2002 | Frish et al. | |
| 6,470,198 B1 | 10/2002 | Kintaka et al. | |
| 6,504,303 B2 | 1/2003 | Small | |
| 6,524,461 B2 | 2/2003 | Taylor et al. | |
| 6,525,477 B2 | 2/2003 | Small | |
| 6,534,766 B2 | 3/2003 | Abe et al. | |
| 6,545,425 B2 | 4/2003 | Victor | |
| 6,552,320 B1 | 4/2003 | Pan | |
| 6,577,040 B2 | 6/2003 | Nguyen | |
| 6,580,075 B2 | 6/2003 | Kametani et al. | |
| 6,603,781 B1 | 8/2003 | Stinson et al. | |
| 6,603,915 B2 | 8/2003 | Glebov et al. | |
| 6,624,916 B1 | 9/2003 | Green et al. | |
| 6,636,185 B1 | 10/2003 | Spitzer et al. | |
| 6,636,534 B2 | 10/2003 | Madey et al. | |
| 6,636,653 B2 | 10/2003 | Miracky et al. | |
| 6,640,023 B2 | 10/2003 | Miller et al. | |
| 6,642,907 B2 | 11/2003 | Hamada et al. | |
| 6,687,034 B2 | 2/2004 | Wine et al. | |
| 6,700,748 B1 | 3/2004 | Cowles et al. | |
| 6,724,486 B1 | 4/2004 | Shull et al. | |
| 6,738,176 B2 | 5/2004 | Rabinowitz et al. | |
| 6,741,781 B2 | 5/2004 | Furuyama | |
| 6,777,244 B2 | 8/2004 | Pepper et al. | |
| 6,782,205 B2 | 8/2004 | Trisnadi et al. | |
| 6,791,438 B2 | 9/2004 | Takahashi et al. | |
| 6,800,877 B2 | 10/2004 | Victor et al. | |
| 6,801,002 B2 | 10/2004 | Victor et al. | |
| 6,808,955 B2 * | 10/2004 | Ma | 438/51 |
| 6,819,432 B2 | 11/2004 | Pepper et al. | |

| | | |
|---|---|---|
| 6,829,286 B1 | 12/2004 | Guilfoyle et al. |
| 6,831,301 B2 * | 12/2004 | Murphy et al. ............... 257/83 |
| 6,834,152 B2 | 12/2004 | Gunn et al. |
| 6,870,438 B1 | 3/2005 | Shino et al. |
| 6,871,025 B2 | 3/2005 | Maleki et al. |
| 6,885,262 B2 | 4/2005 | Nishimura et al. |
| 6,900,447 B2 | 5/2005 | Gerlach et al. |
| 6,908,355 B2 | 6/2005 | Habib et al. |
| 6,909,092 B2 | 6/2005 | Nagahama |
| 6,909,104 B1 | 6/2005 | Koops et al. |
| 6,924,920 B2 | 8/2005 | Zhilkov |
| 6,936,981 B2 | 8/2005 | Gesley |
| 6,943,650 B2 | 9/2005 | Ramprasad et al. |
| 6,944,369 B2 | 9/2005 | Deliwala |
| 6,952,492 B2 | 10/2005 | Tanaka et al. |
| 6,953,291 B2 | 10/2005 | Liu |
| 6,954,515 B2 | 10/2005 | Bjorkholm et al. |
| 6,965,284 B2 | 11/2005 | Maekawa et al. |
| 6,965,625 B2 | 11/2005 | Mross et al. |
| 6,972,439 B1 | 12/2005 | Kim et al. |
| 6,995,406 B2 | 2/2006 | Tojo et al. |
| 7,010,183 B2 | 3/2006 | Estes et al. |
| 7,064,500 B2 | 6/2006 | Victor et al. |
| 7,068,948 B2 | 6/2006 | Wei et al. |
| 7,092,588 B2 | 8/2006 | Kondo |
| 7,092,603 B2 | 8/2006 | Glebov et al. |
| 7,099,586 B2 | 8/2006 | Yoo |
| 7,120,332 B1 | 10/2006 | Spoonhower et al. |
| 7,122,978 B2 | 10/2006 | Nakanishi et al. |
| 7,130,102 B2 | 10/2006 | Rabinowitz |
| 7,177,515 B2 | 2/2007 | Estes et al. |
| 7,194,798 B2 | 3/2007 | Bonhote et al. |
| 7,230,201 B1 | 6/2007 | Miley et al. |
| 7,253,426 B2 | 8/2007 | Gorrell et al. |
| 7,267,459 B2 | 9/2007 | Matheson |
| 7,267,461 B2 | 9/2007 | Kan et al. |
| 7,309,953 B2 | 12/2007 | Tiberi et al. |
| 7,342,441 B2 | 3/2008 | Gorrell et al. |
| 7,359,589 B2 | 4/2008 | Gorrell et al. |
| 7,361,916 B2 | 4/2008 | Gorrell et al. |
| 7,362,972 B2 | 4/2008 | Yavor et al. |
| 7,375,631 B2 | 5/2008 | Moskowitz et al. |
| 7,436,177 B2 | 10/2008 | Gorrell et al. |
| 7,442,940 B2 | 10/2008 | Gorrell et al. |
| 7,443,358 B2 | 10/2008 | Gorrell et al. |
| 7,459,099 B2 | 12/2008 | Kubena et al. |
| 7,459,726 B2 * | 12/2008 | Kato et al. ............... 257/82 |
| 7,470,920 B2 | 12/2008 | Gorrell et al. |
| 7,473,917 B2 | 1/2009 | Singh |
| 7,482,185 B2 * | 1/2009 | Yeh et al. ............... 438/29 |
| 7,554,083 B2 | 6/2009 | Gorrell et al. |
| 7,569,836 B2 | 8/2009 | Gorrell |
| 7,573,045 B2 | 8/2009 | Gorrell et al. |
| 7,586,097 B2 | 9/2009 | Gorrell et al. |
| 7,586,167 B2 | 9/2009 | Gorrell et al. |
| 7,728,702 B2 * | 6/2010 | Gorrell ............... 333/219 |
| 2001/0002315 A1 | 5/2001 | Schultz et al. |
| 2001/0025925 A1 | 10/2001 | Abe et al. |
| 2001/0045360 A1 | 11/2001 | Omasa |
| 2002/0009723 A1 | 1/2002 | Hefti |
| 2002/0027481 A1 | 3/2002 | Fiedziuszko |
| 2002/0036121 A1 | 3/2002 | Ball et al. |
| 2002/0036264 A1 | 3/2002 | Nakasuji et al. |
| 2002/0053638 A1 | 5/2002 | Winkler et al. |
| 2002/0056645 A1 | 5/2002 | Taylor et al. |
| 2002/0068018 A1 | 6/2002 | Pepper et al. |
| 2002/0070671 A1 | 6/2002 | Small |
| 2002/0071457 A1 | 6/2002 | Hogan |
| 2002/0122531 A1 | 9/2002 | Whitham |
| 2002/0135665 A1 | 9/2002 | Gardner |
| 2002/0139961 A1 | 10/2002 | Kinoshita et al. |
| 2002/0158295 A1 | 10/2002 | Armgarth et al. |
| 2002/0191650 A1 | 12/2002 | Madey et al. |
| 2003/0010979 A1 | 1/2003 | Pardo |
| 2003/0012925 A1 | 1/2003 | Gorrell |
| 2003/0016421 A1 | 1/2003 | Small |
| 2003/0034535 A1 | 2/2003 | Barenburu et al. |
| 2003/0103150 A1 | 6/2003 | Catrysse et al. |
| 2003/0106998 A1 | 6/2003 | Colbert et al. |
| 2003/0155521 A1 | 8/2003 | Feuerbaum |
| 2003/0158474 A1 | 8/2003 | Scherer et al. |
| 2003/0164947 A1 | 9/2003 | Vaupel |
| 2003/0179974 A1 | 9/2003 | Estes et al. |
| 2003/0206708 A1 | 11/2003 | Estes et al. |
| 2003/0214695 A1 | 11/2003 | Abramson et al. |
| 2003/0222579 A1 | 12/2003 | Habib et al. |
| 2004/0011432 A1 | 1/2004 | Podlaha et al. |
| 2004/0061053 A1 | 4/2004 | Taniguchi et al. |
| 2004/0080285 A1 | 4/2004 | Victor et al. |
| 2004/0085159 A1 | 5/2004 | Kubena et al. |
| 2004/0092104 A1 | 5/2004 | Gunn, III et al. |
| 2004/0108471 A1 | 6/2004 | Luo et al. |
| 2004/0108473 A1 | 6/2004 | Melnychuk et al. |
| 2004/0108823 A1 | 6/2004 | Amaldi et al. |
| 2004/0136715 A1 | 7/2004 | Kondo |
| 2004/0150991 A1 | 8/2004 | Ouderkirk et al. |
| 2004/0154925 A1 | 8/2004 | Podlaha et al. |
| 2004/0171272 A1 | 9/2004 | Jin et al. |
| 2004/0180244 A1 | 9/2004 | Tour et al. |
| 2004/0184270 A1 | 9/2004 | Halter |
| 2004/0213375 A1 | 10/2004 | Bjorkholm et al. |
| 2004/0217297 A1 | 11/2004 | Moses et al. |
| 2004/0218651 A1 | 11/2004 | Iwasaki et al. |
| 2004/0231996 A1 | 11/2004 | Webb |
| 2004/0240035 A1 | 12/2004 | Zhilkov |
| 2004/0264867 A1 | 12/2004 | Kondo |
| 2005/0023145 A1 | 2/2005 | Cohen et al. |
| 2005/0045821 A1 | 3/2005 | Noji et al. |
| 2005/0045832 A1 | 3/2005 | Kelly et al. |
| 2005/0054151 A1 | 3/2005 | Lowther et al. |
| 2005/0062903 A1 | 3/2005 | Cok et al. |
| 2005/0067286 A1 | 3/2005 | Ahn et al. |
| 2005/0082469 A1 | 4/2005 | Carlo |
| 2005/0092929 A1 | 5/2005 | Schneiker |
| 2005/0104684 A1 | 5/2005 | Wojcik et al. |
| 2005/0105595 A1 | 5/2005 | Martin et al. |
| 2005/0105690 A1 | 5/2005 | Pau et al. |
| 2005/0145882 A1 | 7/2005 | Taylor et al. |
| 2005/0152635 A1 | 7/2005 | Paddon et al. |
| 2005/0162104 A1 | 7/2005 | Victor et al. |
| 2005/0180678 A1 | 8/2005 | Panepucci et al. |
| 2005/0190637 A1 | 9/2005 | Ichimura et al. |
| 2005/0191055 A1 | 9/2005 | Maruyama et al. |
| 2005/0194258 A1 | 9/2005 | Cohen et al. |
| 2005/0201707 A1 | 9/2005 | Glebov et al. |
| 2005/0201717 A1 | 9/2005 | Matsumura et al. |
| 2005/0206314 A1 | 9/2005 | Habib et al. |
| 2005/0212503 A1 | 9/2005 | Deibele |
| 2005/0231138 A1 | 10/2005 | Nakanishi et al. |
| 2005/0249451 A1 | 11/2005 | Baehr-Jones et al. |
| 2005/0285541 A1 | 12/2005 | LeChevalier |
| 2006/0007730 A1 | 1/2006 | Nakamura et al. |
| 2006/0018619 A1 | 1/2006 | Helffrich et al. |
| 2006/0035173 A1 | 2/2006 | Davidson et al. |
| 2006/0045418 A1 | 3/2006 | Cho et al. |
| 2006/0050269 A1 | 3/2006 | Brownell |
| 2006/0060782 A1 | 3/2006 | Khursheed |
| 2006/0062258 A1 | 3/2006 | Brau et al. |
| 2006/0131176 A1 | 6/2006 | Hsu |
| 2006/0131695 A1 | 6/2006 | Kuekes et al. |
| 2006/0159131 A1 | 7/2006 | Liu et al. |
| 2006/0164496 A1 | 7/2006 | Tokutake et al. |
| 2006/0187794 A1 | 8/2006 | Harvey et al. |
| 2006/0208667 A1 | 9/2006 | Lys et al. |
| 2006/0216940 A1 | 9/2006 | Gorrell et al. |
| 2006/0232364 A1 | 10/2006 | Koh et al. |
| 2006/0243925 A1 | 11/2006 | Barker et al. |
| 2006/0274922 A1 | 12/2006 | Ragsdale |
| 2007/0003781 A1 | 1/2007 | de Rochemont |
| 2007/0013765 A1 | 1/2007 | Hudson et al. |
| 2007/0075263 A1 | 4/2007 | Gorrell et al. |
| 2007/0075264 A1 | 4/2007 | Gorrell et al. |
| 2007/0085039 A1 | 4/2007 | Gorrell et al. |
| 2007/0086915 A1 | 4/2007 | LeBoeuf et al. |
| 2007/0116420 A1 | 5/2007 | Estes et al. |
| 2007/0146704 A1 | 6/2007 | Schmidt et al. |
| 2007/0152176 A1 | 7/2007 | Gorrell et al. |
| 2007/0154846 A1 | 7/2007 | Gorrell et al. |

| | | | |
|---|---|---|---|
| 2007/0194357 A1 | 8/2007 | Oohashi | |
| 2007/0200940 A1 | 8/2007 | Gruhlke et al. | |
| 2007/0238037 A1 | 10/2007 | Wuister et al. | |
| 2007/0252983 A1 | 11/2007 | Tong et al. | |
| 2007/0258492 A1 | 11/2007 | Gorrell | |
| 2007/0258689 A1 | 11/2007 | Gorrell et al. | |
| 2007/0258690 A1 | 11/2007 | Gorrell et al. | |
| 2007/0258720 A1 | 11/2007 | Gorrell et al. | |
| 2007/0259641 A1 | 11/2007 | Gorrell | |
| 2007/0264023 A1 | 11/2007 | Gorrell et al. | |
| 2007/0264030 A1 | 11/2007 | Gorrell et al. | |
| 2007/0282030 A1 | 12/2007 | Anderson et al. | |
| 2007/0284527 A1 | 12/2007 | Zani et al. | |
| 2008/0069509 A1 | 3/2008 | Gorrell et al. | |
| 2008/0218102 A1 | 9/2008 | Sliski et al. | |
| 2008/0283501 A1 | 11/2008 | Roy | |
| 2008/0302963 A1 | 12/2008 | Nakasuji et al. | |

FOREIGN PATENT DOCUMENTS

| | | |
|---|---|---|
| JP | 2004-32323 A | 1/2004 |
| WO | WO 87/01873 | 3/1987 |
| WO | WO 93/21663 A1 | 10/1993 |
| WO | WO 98/21788 | 5/1998 |
| WO | WO 00/72413 | 11/2000 |
| WO | WO 02/25785 | 3/2002 |
| WO | WO 02/077607 | 10/2002 |
| WO | WO 2004/086560 | 10/2004 |
| WO | WO 2005/015143 A2 | 2/2005 |
| WO | WO 2005/098966 | 10/2005 |
| WO | WO 2006/042239 A2 | 4/2006 |
| WO | WO 2007/081389 | 7/2007 |
| WO | WO 2007/081390 | 7/2007 |
| WO | WO 2007/081391 | 7/2007 |

OTHER PUBLICATIONS

Kapp, et al., "Modification of a scanning electron microscope to produce Smith-Purcell radiation", Rev. Sci. Instrum. 75, 4732 (2004).
Scherer et al. "Photonic Crystals for Confining, Guiding, and Emitting Light", IEEE Transactions on Nanotechnology, vol. 1, No. 1, Mar. 2002, pp. 4-11.
U.S. Appl. No. 11/203,407—Jul. 17, 2009 PTO Office Action.
U.S. Appl. No. 11/418,089—Jul. 15, 2009 PTO Office Action.
U.S. Appl. No. 11/418,097—Sep. 16, 2009 PTO Office Action.
U.S. Appl. No. 11/418,123—Aug. 11, 2009 PTO Office Action.
U.S. Appl. No. 11/418,365—Jul. 23, 2009 PTO Office Action.
U.S. Appl. No. 11/441,240—Aug. 31, 2009 PTO Office Action.
Urata et al., "Superradiant Smith-Purcell Emission", Phys. Rev. Lett. 80, 516-519 (1998).
International Search Report and Written Opinion mailed Nov. 23, 2007 in International Application No. PCT/US2006/022786.
Search Report and Written Opinion mailed Oct. 25, 2007 in PCT Appln. No. PCT/US2006/022687.
Search Report and Written Opinion mailed Oct. 26, 2007 in PCT Appln. No. PCT/US2006/022675.
Search Report and Written Opinion mailed Sep. 21, 2007 in PCT Appln. No. PCT/US2006/022688.
Search Report and Written Opinion mailed Sep. 25, 2007 in PCT Appln. No. PCT/US2006/022681.
Search Report and Written Opinion mailed Sep. 26, 2007 in PCT Appln. No. PCT/US2006/024218.
Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.
Markoff, John, "A Chip That Can Transfer Data Using Laser Light," The New York Times, Sep. 18, 2006.
S.M. Sze, "Semiconductor Devices Physics and Technology", 2nd Edition, Chapters 9 and 12, Copyright 1985, 2002.
Search Report and Written Opinion mailed Feb. 12, 2007 in PCT Appln. No. PCT/US2006/022682.
Search Report and Written Opinion mailed Feb. 20, 2007 in PCT Appln. No. PCT/US2006/022676.
Search Report and Written Opinion mailed Feb. 20, 2007 in PCT Appln. No. PCT/US2006/022772.
Search Report and Written Opinion mailed Feb. 20, 2007 in PCT Appln. No. PCT/US2006/022780.
Search Report and Written Opinion mailed Feb. 21, 2007 in PCT Appln. No. PCT/US2006/022684.
Search Report and Written Opinion mailed Jan. 17, 2007 in PCT Appln. No. PCT/US2006/022777.
Search Report and Written Opinion mailed Jan. 23, 2007 in PCT Appln. No. PCT/US2006/022781.
Search Report and Written Opinion mailed Mar. 7, 2007 in PCT Appln. No. PCT/US2006/022775.
Speller et al., "A Low-Noise MEMS Accelerometer for Unattended Ground Sensor Applications", Applied MEMS Inc., 12200 Parc Crest, Stafford, TX, USA 77477.
Thurn-Albrecht et al., "Ultrahigh-Density Nanowire Arrays Grown in Self-Assembled Diblock Copolymer Templates", Science 290. 5499, Dec. 15, 2000, pp. 2126-2129.
Search Report and Written Opinion mailed Aug. 24, 2007 in PCT Appln. No. PCT/US2006/022768.
Search Report and Written Opinion mailed Aug. 31, 2007 in PCT Appln. No. PCT/US2006/022680.
Search Report and Written Opinion mailed Jul. 16, 2007 in PCT Appln. No. PCT/US2006/022774.
Search Report and Written Opinion mailed Jul. 20, 2007 in PCT Appln. No. PCT/US2006/024216.
Search Report and Written Opinion mailed Jul. 26, 2007 in PCT Appln. No. PCT/US2006/022776.
Search Report and Written Opinion mailed Jun. 20, 2007 in PCT Appln. No. PCT/US2006/022779.
Search Report and Written Opinion mailed Sep. 12, 2007 in PCT Appln. No. PCT/US2006/022767.
Search Report and Written Opinion mailed Sep. 13, 2007 in PCT Appln. No. PCT/US2006/024217.
Search Report and Written Opinion mailed Sep. 17, 2007 in PCT Appln. No. PCT/US2006/022787.
Search Report and Written Opinion mailed Sep. 5, 2007 in PCT Appln. No. PCT/US2006/027428.
Search Report and Written Opinion mailed Sep. 17, 2007 in PCT Appln. No. PCT/US2006/022689.
U.S. Appl. No. 11/418,082, filed May 5, 2006, Gorrell et al.
J. C. Palais, "Fiber optic communications," Prentice Hall, New Jersey, 1998, pp. 156-158.
Search Report and Written Opinion mailed Dec. 20, 2007 in PCT Appln. No. PCT/US2006/022771.
Search Report and Written Opinion mailed Jan. 31, 2008 in PCT Appln. No. PCT/US2006/027427.
Search Report and Written Opinion mailed Jan. 8, 2008 in PCT Appln. No. PCT/US2006/028741.
Search Report and Written Opinion mailed Mar. 11, 2008 in PCT Appln. No. PCT/US2006/022679.
"An Early History—Invention of the Klystron," http://varianinc.com/cgi-bin/advprint/print.cgi?cid=KLQNPPJJFJ, printed on Dec. 26, 2008.
"An Early History—The Founding of Varian Associates," http://varianinc.com/cgi-bin/advprint/print.cgi?cid=KLQNPPJJFJ, printed on Dec. 26, 2008.
"Chapter 3 X-Ray Tube," http://compepid.tuskegee.edu/syllabi/clinical/small/radiology/chapter . . . , printed from tuskegee.edu on Dec. 29, 2008.
"Diagnostic imaging modalities—Ionizing vs non-ionizing radiation," http://info.med.yale.edu/intmed/cardio/imaging/techniques/ionizing_v . . . , printed from Yale University School of Medicine on Dec. 29, 2008.
"Frequently Asked Questions," Luxtera Inc., found at http://www.luxtera.com/technology_faq.htm, printed on Dec. 2, 2005, 4 pages.
"Klystron Amplifier," http://www.radartutorial.eu/08.transmitters/tx12.en.html, printed on Dec. 26, 2008.
"Klystron is a Micowave Generator," http://www2.slac.stanford.edu/vvc/accelerators/klystron.html, printed on Dec. 26, 2008.
"Klystron," http:en.wikipedia.org/wiki/Klystron, printed on Dec. 26, 2008.

"Making X-rays," http://www.fnrfscience.cmu.ac.th/theory/radiation/xray-basics.html, printed on Dec. 29, 2008.
"Microwave Tubes," http://www.tpub.com/neets/book11/45b.htm, printed on Dec. 26, 2008.
"Notice of Allowability" mailed on Jan. 17, 2008 in U.S. Appl. No. 11/418,082, filed May 5, 2006.
"Technology Overview," Luxtera, Inc., found at http://www.luxtera.com/technology.htm, printed on Dec. 2, 2005, 1 page.
"The Reflex Klystron," http://www.fnrfscience.cmu.ac.th/theory/microwave/microwave%2, printed from Fast Netoron Research Facilty on Dec. 26, 2008.
"X-ray tube," http://www.answers.com/topic/x-ray-tube, printed on Dec. 29, 2008.
Mar. 24, 2006 PTO Office Action in U.S. Appl. No. 10/917,511.
Mar. 25, 2008 PTO Office Action in U.S. Appl. No. 11/411,131.
Apr. 8, 2008 PTO Office Action in U.S. Appl. No. 11/325,571.
Apr. 17, 2008 Response to PTO Office Action of Dec. 20, 2007 in U.S. Appl. No. 11/418,087.
Apr. 19, 2007 Response to PTO Office Action of Jan. 17, 2007 in U.S. Appl. No. 11/418,082.
May 10, 2005 PTO Office Action in U.S. Appl. No. 10/917,511.
May 21, 2007 PTO Office Action in U.S. Appl. No. 11/418,087.
May 26, 2006 Response to PTO Office Action of Mar. 24, 2006 in U.S. Appl. No. 10/917,511.
Jun. 16, 2008 Response to PTO Office Action of Dec. 14, 2007 in U.S. Appl. No. 11/418,264.
Jun. 20, 2008 Response to PTO Office Action of Mar. 25, 2008 in U.S. Appl. No. 11/411,131.
Aug. 14, 2006 PTO Office Action in U.S. Appl. No. 10/917,511.
Sep. 1, 2006 Response to PTO Office Action of Aug. 14, 2006 in U.S. Appl. No. 10/917,511.
Sep. 12, 2005 Response to PTO Office Action of May 10, 2005 in U.S. Appl. No. 10/917,511.
Sep. 14, 2007 PTO Office Action in U.S. Appl. No. 11/411,131.
Oct. 19, 2007 Response to PTO Office Action of May 21, 2007 in U.S. Appl. No. 11/418,087.
Dec. 4, 2006 PTO Office Action in U.S. Appl. No. 11/418,087.
Dec. 14, 2007 PTO Office Action in U.S. Appl. No. 11/418,264.
Dec. 14, 2007 Response to PTO Office Action of Sep. 14, 2007 in U.S. Appl. No. 11/411,131.
Dec. 20, 2007 PTO Office Action in U.S. Appl. No. 11/418,087.
Corcoran, Elizabeth, "Ride the Light," Forbes Magazine, Apr. 11, 2005, pp. 68-70.
European Search Report mailed Mar. 3, 2009 in European Application No. 06852028.7.
Neo et al., "Smith-Purcell Radiation from Ultraviolet to Infrared Using a Si-field Emitter" Vacuum Electronics Conference, 2007, IVEC '07, IEEE International May 2007.
Ossia, Babak, "The X-Ray Production," Department of Biomedical Engineering—University of Rhode Island, 1 page.
Sadwick, Larry et al., "Microfabricated next-generation millimeter-wave power amplifiers," www.rfdesign.com.
Saraph, Girish P. et al., "Design of a Single-Stage Depressed Collector for High-Power, Pulsed Gyroklystrom Amplifiers," IEEE Transactions on Electron Devices, vol. 45, No. 4, Apr. 1998, pp. 986-990.
Sartori, Gabriele, "CMOS Photonics Platform," Luxtera, Inc., Nov. 2005, 19 pages.
Search Report and Writen Opinion mailed Jul. 14, 2008 in PCT Appln. No. PCT/US2006/022773.
Search Report and Written Opinion mailed Aug. 19, 2008 in PCT Appln. No. PCT/US2007/008363.
Search Report and Written Opinion mailed Jul. 16, 2008 in PCT Appln. No. PCT/US2006/022766.
Search Report and Written Opinion mailed Jul. 28, 2008 in PCT Appln. No. PCT/US2006/022782.
Search Report and Written Opinion mailed Jul. 3, 2008 in PCT Appln. No. PCT/US2006/022690.
Search Report and Written Opinion mailed Jul. 3, 2008 in PCT Appln. No. PCT/US2006/022778.
Search Report and Written Opinion mailed Jul. 7, 2008 in PCT Appln. No. PCT/US2006/022686.
Search Report and Written Opinion mailed Jul. 7, 2008 in PCT Appln. No. PCT/US2006/022785.
Search Report and Written Opinion mailed Sep. 2, 2008 in PCT Appln. No. PCT/US2006/022769.
Search Report and Written Opinion mailed Sep. 26, 2008 in PCT Appln. No. PCT/US2007/00053.
Search Report and Written Opinion mailed Sep. 3, 2008 in PCT Appln. No. PCT/US2006/022770.
Thumm, Manfred, "Historical German Contributions to Physics and Applications of Electromagnetic Oscillations and Waves."
U.S. Appl. No. 11/203,407—Nov. 13, 2008 PTO Office Action.
U.S. Appl. No. 11/238,991—Dec. 6, 2006 PTO Office Action.
U.S. Appl. No. 11/238,991—Jun. 6, 2006 Response to PTO Office Action of Dec. 6, 2006.
U.S. Appl. No. 11/238,991—Sep. 10, 2007 PTO Office Action.
U.S. Appl. No. 11/238,991—Mar. 6, 2008 Response to PTO Office Action of Sep. 10, 2007
U.S. Appl. No. 11/238,991—Jun. 27, 2008 PTO Office Action.
U.S. Appl. No. 11/238,991—Dec. 29, 2008 Response to PTO Office Action of Jun. 27, 2008.
U.S. Appl. No. 11/238,991—Mar. 24, 2009 PTO Office Action.
U.S. Appl. No. 11/243,477—Apr. 25, 2008 PTO Office Action.
U.S. Appl. No. 11/243,477—Oct. 24, 2008 Response to PTO Office Action of Apr. 25, 2008.
U.S. Appl. No. 11/243,477—Jan. 7, 2009 PTO Office Action.
U.S. Appl. No. 11/325,448—Jun. 16, 2008 PTO Office Action.
U.S. Appl. No. 11/325,448—Dec. 16, 2008 Response to PTO Office Action of Jun. 16, 2008.
U.S. Appl. No. 11/325,534—Jun. 11, 2008 PTO Office Action.
U.S. Appl. No. 11/325,534—Oct. 15, 2008 Response to PTO Office Action of Jun. 11, 2008.
U.S. Appl. No. 11/353,208—Jan. 15, 2008 PTO Office Action.
U.S. Appl. No. 11/353,208—Mar. 17, 2008 PTO Office Action.
U.S. Appl. No. 11/353,208—Sep. 15, 2008 Response to PTO Office Action of Mar. 17, 2008.
U.S. Appl. No. 11/353,208—Dec. 24, 2008 PTO Office Action.
U.S. Appl. No. 11/353,208—Dec. 30, 2008 Response to PTO Office Action of Dec. 24, 2008.
U.S. Appl. No. 11/400,280—Oct. 16, 2008 PTO Office Action.
U.S. Appl. No. 11/400,280—Oct. 24, 2008 Response to PTO Office Action of Oct. 16, 2008.
U.S. Appl. No. 11/410,905—Sep. 26, 2008 PTO Office Action.
U.S. Appl. No. 11/410,905—Mar. 26, 2009 Response to PTO Office Action of Sep. 26, 2008.
U.S. Appl. No. 11/410,924—Mar. 6, 2009 PTO Office Action.
U.S. Appl. No. 11/411,120—Mar. 19, 2009 PTO Office Action.
U.S. Appl. No. 11/411,129—Jan. 16, 2009 Office Action.
U.S. Appl. No. 11/411,130—May 1, 2008 PTO Office Action.
U.S. Appl. No. 11/411,130—Oct. 29, 2008 Response to PTO Office Action of May 1, 2008.
U.S. Appl. No. 11/417,129—Jul. 11, 2007 PTO Office Action.
U.S. Appl. No. 11/417,129—Dec. 17, 2007 Response to PTO Office Action of Jul. 11, 2007.
U.S. Appl. No. 11/417,129—Dec. 20, 2007 Response to PTO Office Action of Jul. 11, 2007.
U.S. Appl. No. 11/417,129—Apr. 17, 2008 PTO Office Action.
U.S. Appl. No. 11/417,129—Jun. 19, 2008 Response to PTO Office Action of Apr. 17, 2008.
U.S. Appl. No. 11/418,079—Apr. 11, 2008 PTO Office Action.
U.S. Appl. No. 11/418,079—Oct. 7, 2008 Response to PTO Office Action of Apr. 11, 2008.
U.S. Appl. No. 11/418,079—Feb. 12, 2009 PTO Office Action.
U.S. Appl. No. 11/418,080—Mar. 18, 2009 PTO Office Action.
U.S. Appl. No. 11/418,082—Jan. 17, 2007 PTO Office Action.
U.S. Appl. No. 11/418,083—2008-Jun. 20, 2008 PTO Office Action.
U.S. Appl. No. 11/418,083—Dec. 18, 2008 Response to PTO Office Action of Jun. 20, 2008.
U.S. Appl. No. 11/418,084—Nov. 5, 2007 PTO Office Action.
U.S. Appl. No. 11/418,084—May 5, 2008 Response to PTO Office Action of Nov. 5, 2007.
U.S. Appl. No. 11/418,084—Aug. 19, 2008 PTO Office Action.
U.S. Appl. No. 11/418,084—Feb. 19, 2009 Response to PTO Office Action of Aug. 19, 2008.
U.S. Appl. No. 11/418,085—Aug. 10, 2007 PTO Office Action.

U.S. Appl. No. 11/418,085—Nov. 13, 2007 Response to PTO Office Action of Aug. 10, 2007.
U.S. Appl. No. 11/418,085—Feb. 12, 2008 PTO Office Action.
U.S. Appl. No. 11/418,085—Aug. 12, 2008 Response to PTO Office Action of Feb. 12, 2008.
U.S. Appl. No. 11/418,085—Sep. 16, 2008 PTO Office Action.
U.S. Appl. No. 11/418,085—Mar. 6, 2009 Response to PTO Office Action of Sep. 16, 2008.
U.S. Appl. No. 11/418,087—Dec. 29, 2006 Response to PTO Office Action of Dec. 4, 2006.
U.S. Appl. No. 11/418,085—Feb. 15, 2007 PTO Office Action.
U.S. Appl. No. 11/418,087—Mar. 6, 2007 Response to PTO Office Action of Feb. 15, 2007.
U.S. Appl. No. 11/418,088—Jun. 9, 2008 PTO Office Action.
U.S. Appl. No. 11/418,088—Dec. 8, 2008 Response to PTO Office Action of Jun. 9, 2008.
U.S. Appl. No. 11/418,089—Mar. 21, 2008 PTO Office Action.
U.S. Appl. No. 11/418,089—Jun. 23, 2008 Response to PTO Office Action of Mar. 21, 2008.
U.S. Appl. No. 11/418,089—Sep. 30, 2008 PTO Office Action.
U.S. Appl. No. 11/418,089—Mar. 30, 2009 Response to PTO Office Action of Sep. 30, 2008.
U.S. Appl. No. 11/418,091—Jul. 30, 2007 PTO Office Action.
U.S. Appl. No. 11/418,091—Nov. 27, 2007 Response to PTO Office Action of Jul. 30, 2007.
U.S. Appl. No. 11/418,091—Feb. 26, 2008 PTO Office Action.
U.S. Appl. No. 11/418,097—Jun. 2, 2008 PTO Office Action.
U.S. Appl. No. 11/418,097—Dec. 2, 2008 Response to PTO Office Action of Jun. 2, 2008.
U.S. Appl. No. 11/418,097—Feb. 18, 2009 PTO Office Action.
U.S. Appl. No. 11/418,099—Jun. 23, 2008 PTO Office Action.
U.S. Appl. No. 11/418,099—Dec. 23, 2008 Response to PTO Office Action of Jun. 23, 2008.
U.S. Appl. No. 11/418,100—Jan. 12, 2009 PTO Office Action.
U.S. Appl. No. 11/418,123—Apr. 25, 2008 PTO Office Action.
U.S. Appl. No. 11/418,123—Oct. 27, 2008 Response to PTO Office Action of Apr. 25, 2008.
U.S. Appl. No. 11/418,123—Jan. 26, 2009 PTO Office Action.
U.S. Appl. No. 11/418,124—Oct. 1, 2008 PTO Office Action.
U.S. Appl. No. 11/418,124—Feb. 2, 2009 Response to PTO Office Action of Oct. 1, 2008.
U.S. Appl. No. 11/418,124—Mar. 13, 2009 PTO Office Action.
U.S. Appl. No. 11/418,126—Oct. 12, 2006 PTO Office Action.
U.S. Appl. No. 11/418,126—Feb. 12, 2007 Response to PTO Office Action of Oct. 12, 2006 (Redacted).
U.S. Appl. No. 11/418,126—Jun. 6, 2007 PTO Office Action.
U.S. Appl. No. 11/418,126—Aug. 6, 2007 Response to PTO Office Action of Jun. 6, 2007.
U.S. Appl. No. 11/418,126—Nov. 2, 2007 PTO Office Action.
U.S. Appl. No. 11/418,126—Feb. 22, 2008 Response to PTO Office Action of Nov. 2, 2007.
U.S. Appl. No. 11/418,126—Jun. 10, 2008 PTO Office Action.
U.S. Appl. No. 11/418,127—Apr. 2, 2009 Office Action.
U.S. Appl. No. 11/418,128—Dec. 16, 2008 PTO Office Action.
U.S. Appl. No. 11/418,128—Dec. 31, 2008 Response to PTO Office Action of Dec. 16, 2008.
U.S. Appl. No. 11/418,128—Feb. 17, 2009 PTO Office Action.
U.S. Appl. No. 11/418,129—Dec. 16, 2008 Office Action.
U.S. Appl. No. 11/418,129—Dec. 31, 2008 Response to PTO Office Action of Dec. 16, 2008.
U.S. Appl. No. 11/418,244—Jul. 1, 2008 PTO Office Action.
U.S. Appl. No. 11/418,244—Nov. 25, 2008 Response to PTO Office Action of Jul. 1, 2008.
U.S. Appl. No. 11/418,263—Sep. 24, 2008 PTO Office Action.
U.S. Appl. No. 11/418,263—Dec. 24, 2008 Response to PTO Office Action of Sep. 24, 2008.
U.S. Appl. No. 11/418,263—Mar. 3, 2009 PTO Office Action.
U.S. Appl. No. 11/418,315—Mar. 31, 2008 PTO Office Action.
U.S. Appl. No. 11/418,318—Mar. 31, 2009 PTO Office Action.
U.S. Appl. No. 11/441,219—Jan. 7, 2009 PTO Office Action.
U.S. Appl. No. 11/522,929—Oct. 22, 2007 PTO Office Action.
U.S. Appl. No. 11/522,929—Feb. 21, 2008 Response to PTO Office Action of Oct. 22, 2007.
U.S. Appl. No. 11/641,678—Jul. 22, 2008 PTO Office Action.
U.S. Appl. No. 11/641,678—Jan. 22, 2009 Response to Office Action of Jul. 22, 2008.
U.S. Appl. No. 11/711,000—Mar. 6, 2009 PTO Office Action.
U.S. Appl. No. 11/716,552—Feb. 12, 2009 Response to PTO Office Action of Feb. 9, 2009.
U.S. Appl. No. 11/716,552—Jul. 3, 2009 PTO Office Action.
Whiteside, Andy et al., "Dramatic Power Savings using Depressed Collector IOT Transmitters in Digital and Analog Service."
Search Report and Written Opinion mailed Apr. 23, 2008 in PCT Appln. No. PCT/US2006/022678.
Search Report and Written Opinion mailed Apr. 3, 2008 in PCT Appln. No. PCT/US2006/027429.
Search Report and Written Opinion mailed Jun. 18, 2008 in PCT Appln. No. PCT/US2006/027430.
Search Report and Written Opinion mailed Jun. 3, 2008 in PCT Appln. No. PCT/US2006/022783.
Search Report and Written Opinion mailed Mar. 24, 2008 in PCT Appln. No. PCT/US2006/022677.
Search Report and Written Opinion mailed Mar. 24, 2008 in PCT Appln. No. PCT/US2006/022784.
Search Report and Written Opinion mailed May 2, 2008 in PCT Appln. No. PCT/US2006/023280.
Search Report and Written Opinion mailed May 21, 2008 in PCT Appln. No. PCT/US2006/023279.
Search Report and Written Opinion mailed May 22, 2008 in PCT Appln. No. PCT/US2006/022685.
"Array of Nanoklystrons for Frequency Agility or Redundancy," NASA's Jet Propulsion Laboratory, NASA Tech Briefs, NPO-21033. 2001.
"Hardware Development Programs," Calabazas Creek Research, Inc. found at http://calcreek.com/hardware.html.
"Antenna Arrays." May 18, 2002. www.tpub.com/content/neets/14183/css/14183_159.htm.
"Diffraction Grating," hyperphysics.phy-astr.gsu.edu/hbase/phyopt/grating.html.
Alford, T.L. et al., "Advanced silver-based metallization patterning for ULSI applications," Microelectronic Engineering 55, 2001, pp. 383-388, Elsevier Science B.V.
Amato, Ivan, "An Everyman's Free-Electron Laser?" Science, New Series, Oct. 16, 1992, p. 401, vol. 258 No. 5081, American Association for the Advancement of Science.
Andrews, H.L. et al., "Dispersion and Attenuation in a Smith-Purcell Free Electron Laser," The American Physical Society, Physical Review Special Topics—Accelerators and Beams 8 (2005), pp. 050703-1-050703-9.
Backe, H. et al. "Investigation of Far-Infrared Smith-Purcell Radiation at the 3.41 MeV Electron Injector Linac of the Mainz Microtron MAMI," Institut fur Kernphysik, Universitat Mainz, D-55099, Mainz Germany.
Bakhtyari, A. et al., "Horn Resonator Boosts Miniature Free-Electron Laser Power," Applied Physics Letters, May 12, 2003, pp. 3150-3152, vol. 82, No. 19, American Institute of Physics.
Bakhtyari, Dr. Arash, "Gain Mechanism in a Smith-Purcell MicroFEL," Abstract, Department of Physics and Astronomy, Dartmouth College.
Bhattacharjee, Sudeep et al., "Folded Waveguide Traveling-Wave Tube Sources for Terahertz Radiation." IEEE Transactions on Plasma Science, vol. 32. No. 3, Jun. 2004, pp. 1002-1014.
Booske, J.H. et al., "Microfabricated TWTs as High Power, Wideband Sources of THz Radiation".
Brau, C.A. et al., "Gain and Coherent Radiation from a Smith-Purcell Free Electron Laser," Proceedings of the 2004 FEL Conference, pp. 278-281.
Brownell, J.H. et al., "Improved μFEL Performance with Novel Resonator," Jan. 7, 2005, from website: www.frascati.enea.it/thzbridge/workshop/presentations/Wednesday/We-07-Brownell.ppt.
Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.

Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.

Chuang, S.L. et al., "Smith-Purcell Radiation from a Charge Moving Above a Penetrable Grating," IEEE MTT-S Digest, 1983, pp. 405-406, IEEE.

Far-IR, Sub-MM & MM Detector Technology Workshop list of manuscripts, session 6 2002.

Feltz, W.F. et al., "Near-Continuous Profiling of Temperature, Moisture, and Atmospheric Stability Using the Atmospheric Emitted Radiance Interferometer (AERI)," Journal of Applied Meteorology, May 2003, vol. 42 No. 5, H.W. Wilson Company, pp. 584-597.

Freund, H.P. et al., "Linearized Field Theory of a Smith-Purcell Traveling Wave Tube," IEEE Transactions on Plasma Science, Jun. 2004, pp. 1015-1027, vol. 32 No. 3, IEEE.

Gallerano, G.P. et al., "Overview of Terahertz Radiation Sources," Proceedings of the 2004 FEL Conference, pp. 216-221.

Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.

Gover, A. et al., "Angular Radiation Pattern of Smith-Purcell Radiation," Journal of the Optical Society of America, Oct. 1984, pp. 723-728, vol. 1 No. 5, Optical Society of America.

Grishin, Yu. A. et al., "Pulsed Orotron—A New Microwave Source for Submillimeter Pulse High-Field Electron Paramagnetic Resonance Spectroscopy," Review of Scientific Instruments, Sep. 2004, pp. 2926-2936, vol. 75 No. 9, American Institute of Physics.

Ishizuka, H. et al., "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.

Ishizuka, H. et al., "Smith-Purcell Radiation Experiment Using a Field-Emission Array Cathode," Nuclear Instruments and Methods in Physics Research, 2000, pp. 276-280, A 445, Elsevier Science B.V.

Ives, Lawrence et al., "Development of Backward Wave Oscillators for Terahertz Applications," Terahertz for Military and Security Applications, Proceedings of SPIE vol. 5070 (2003), pp. 71-82.

Ives, R. Lawrence, "IVEC Summary, Session 2, Sources I" 2002.

Jonietz, Erika, "Nano Antenna Gold nanospheres show path to all-optical computing," Technology Review, Dec. 2005/Jan. 2006, p. 32.

Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA Nov. 1995 No. 117-121.

Joo, Youngcheol et al., "Fabrication of Monolithic Microchannels for IC Chip Cooling," 1995, Mechanical, Aerospace and Nuclear Engineering Department, University of California at Los Angeles.

Jung, K.B. et al., "Patterning of Cu, Co, Fe, and Ag for magnetic nanostructures," J. Vac. Sci. Technol. A 15(3), May/Jun. 1997, pp. 1780-1784.

Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.

Kiener, C. et al., "Investigation of the Mean Free Path of Hot Electrons in GaAs/AIGaAs Heterostructures," Semicond. Sci. Technol., 1994, pp. 193-197, vol. 9, IOP Publishing Ltd., United Kingdom.

Kim, Shang Hoon, "Quantum Mechanical Theory of Free-Electron Two-Quantum Stark Emission Driven by Transverse Motion," Journal of the Physical Society of Japan, Aug. 1993, vol. 62 No. 8, pp. 2528-2532.

Korbly, S.E. et al., "Progress on a Smith-Purcell Radiation Bunch Length Diagnostic," Plasma Science and Fusion Center, MIT, Cambridge, MA.

Kormann, T. et al., "A Photoelectron Source for the Study of Smith-Purcell Radiation".

Kube, G. et al., "Observation of Optical Smith-Purcell Radiation at an Electron Beam Energy of 855 MeV," Physical Review E, May 8, 2002, vol. 65, The American Physical Society, pp. 056501-1-056501-15.

Liu, Chuan Sheng, et al., "Stimulated Coherent Smith-Purcell Radiation from a Metallic Grating," IEEE Journal of Quantum Electronics, Oct. 1999, pp. 1386-1389, vol. 35, No. 10, IEEE.

Manohara, Harish et al., "Field Emission Testing of Carbon Nanotubes for THz Frequency Vacuum Microtube Sources." Abstract. Dec. 2003. from SPIEWeb.

Manohara, Harish M. et al., "Design and Fabrication of a THz Nanoklystron".

Manohara, Harish M. et al., "Design and Fabrication of a THz Nanoklystron" (www.sofia.usra.edu/det_workshop/ posters/session 3/3-43manohara poster.pdf), PowerPoint Presentation.

McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.

Meyer, Stephan, "Far IR, Sub-MM & MM Detector Technology Workshop Summary," Oct. 2002. (may date the Manohara documents).

Mokhoff, Nicolas, "Optical-speed light detector promises fast space talk," EETimes Online, Mar. 20, 2006, from website: www.eetimes.com/showArticle.jhtml?articleID=183701047.

Nguyen, Phucanh et al., "Novel technique to pattern silver using CF4 and CF4/O2 glow discharges," J.Vac. Sci. Technol. B 19(1), Jan./Feb. 2001, American Vacuum Society, pp. 158-165.

Nguyen, Phucanh et al., "Reactive ion etch of patterned and blanket silver thin films in CI2/O2 and O2 glow discharges," J. Vac. Sci, Technol. B. 17 (5), Sep./Oct. 1999, American Vacuum Society, pp. 2204-2209.

Ohtaka, Kazuo, "Smith-Purcell Radiation from Metallic and Dielectric Photonic Crystals," Center for Frontier Science, pp. 272-273, Chiba University, 1-33 Yayoi, Inage-ku, Chiba-shi, Japan.

Phototonics Research, "Surface-Plasmon-Enhanced Random Laser Demonstrated," Phototonics Spectra, Feb. 2005, pp. 112-113.

Platt, C.L. et al., "A New Resonator Design for Smith-Purcell Free Electron Lasers," 6Q19, p. 296.

Potylitsin, A.P., "Resonant Diffraction Radiation and Smith-Purcell Effect," (Abstract), arXiv: physics/9803043 v2 Apr. 13, 1998.

Potylitsyn, A.P., "Resonant Diffraction Radiation and Smith-Purcell Effect," Physics Letters A, Feb. 2, 1998, pp. 112-116, A 238, Elsevier Science B.V.

S. Hoogland et al., "A solution-processed 1.53 μm quantum dot laser with temperature-invariant emission wavelength," Optics Express, vol. 14, No. 8, Apr. 17, 2006, pp. 3273-3281.

Savilov, Andrey V., "Stimulated Wave Scattering in the Smith-Purcell FEL," IEEE Transactions on Plasma Science, Oct. 2001, pp. 820-823, vol. 29 No. 5, IEEE.

Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.

Schachter, Levi, "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.

Schachter, Levi, "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institute of Physics.

Shih, I. et al., "Experimental Investigations of Smith-Purcell Radiation," Journal of the Optical Society of America, Mar. 1990, pp. 351-356, vol. 7, No. 3, Optical Society of America.

Shih, I. et al., "Measurements of Smith-Purcell Radiation," Journal of the Optical Society of America, Mar. 1990, pp. 345-350, vol. 7 No. 3, Optical Society of America.

Swartz, J.C. et al., "THz-FIR Grating Coupled Radiation Source," Plasma Science, 1998. 1D02, p. 126.

Temkin, Richard, "Scanning with Ease Through the Far Infrared," Science, New Series, May 8, 1998, p. 854, vol. 280, No. 5365, American Association for the Advancement of Science.

Walsh, J.E., et al., 1999. From website: http://www.ieee.org/organizations/pubs/newsletters/leos/feb99/hot2.htm.

Wentworth, Stuart M. et al., "Far-Infrared Composite Microbolometers," IEEE MTT-S Digest, 1990, pp. 1309-1310.

Yamamoto, N. et al., "Photon Emission From Silver Particles Induced by a High-Energy Electron Beam," Physical Review B, Nov. 6, 2001, pp. 205419-1-205419-9, vol. 64, The American Physical Society.

Yokoo, K. et al., "Smith-Purcell Radiation at Optical Wavelength Using a Field-Emitter Array," Technical Digest of IVMC, 2003, pp. 77-78.

Zeng, Yuxiao et al., "Processing and encapsulation of silver patterns by using reactive ion etch and ammonia anneal," Materials Chemistry and Physics 66, 2000, pp. 77-82.

"Notice of Allowability" mailed on Jul. 2, 2009 in U.S. Appl. No. 11/410,905, filed Apr. 26, 2006.

"Notice of Allowability" mailed on Jun. 30, 2009 in U.S. Appl. No. 11/418,084, filed May 5, 2006.

B. B Loechel et al., "Fabrication of Magnetic Microstructures by Using Thick Layer Resists", Microelectronics Eng., vol. 21, pp. 463-466 (1993).

Magellan 8500 Scanner Product Reference Guide, PSC Inc., 2004, pp. 6-27-F18.

Magellan 9500 with SmartSentry Quick Reference Guide, PSC Inc., 2004.

Response to Non-Final Office Action submitted May 13, 2009 in U.S. Appl. No. 11/203,407.

U.S. Appl. No. 11/238,991—May 11, 2009 PTO Office Action.

U.S. Appl. No. 11/350,812—Apr. 17, 2009 Office Action.

U.S. Appl. No. 11/411,130—Jun. 23, 2009 PTO Office Action.

U.S. Appl. No. 11/418,096—Jun. 23, 2009 PTO Office Action.

U.S. Appl. No. 11/433,486—Jun. 19, 2009 PTO Office Action.

Bekefi et al., "Stimulated Raman Scattering by an Intense Relativistic Electron Beam Subjected to a Rippled Electron Field", Aug. 1979, J. Appl. Phys., 50(8), 5168-5164.

European Search Report mailed Nov. 2, 2009 (related to PCT/US2006/022782).

Gervasoni J.L. et al., "Plasmon Excitations in Cylindrical Wires by External Charged Particles," Physical Review B (Condensed Matter and Materials Physics) APS through AIP USA, vol. 68, No. 23, Dec. 15, 2003, pp. 235302-1, XP002548423, ISSN: 0163-1829.

Gervasoni, J.L., "Excitations of Bulk and Surface Plasmons in Solids and Nanostructures," Surface and Interface Analysis, Apr. 2006, John Wiley and Sons Ltd GB, vol. 38, No. 4, Apr. 2006, pp. 583-586, XP002548422.

Kaplan et al.: "Extreme-Ultraviolet and X-ray Emission and Amplification by Nonrelativistic Electron Beams Traversing a Superlattice" Applied Physics Letters, AIP, American Institute of Physics, Melville, NY LNKD-DOI: 10.1063/1.94869, vol. 44, No. 7, Apr. 1, 1984, pp. 661-663, XP000706537 ISSN: 0003-6951.

Rich, Alan, "Shielding and Guarding, How to Exclude Interference-type noise," Analog Dialogue 17-1, 1983.

Smith et al. "Enhanced Diffraction from a Grating on the Surface of a Negative-Index Metamaterial," Physical Review Letters, vol. 93, No. 13, 2004.

Supplementary European Search Report mailed Jul. 2, 2010 in EP Appln. No. 06772832.9.

Supplementary European Search Report mailed Jul. 5, 2010 in EP Appln. No. 06772830.3.

U.S. Appl. No. 11/411,129—Jan. 28, 2010 PTO Office Action.

U.S. Appl. No. 11/418,079—Jan. 7, 2010 PTO Office Action.

U.S. Appl. No. 11/418,080—Jan. 5, 2010 PTO Office Action.

U.S. Appl. No. 11/418,086—Mar. 4, 2010 PTO Office Action.

U.S. Appl. No. 11/418,128—Nov. 24, 2009 PTO Office Action.

U.S. Appl. No. 11/418,263—Dec. 9, 2009 PTO Office Action.

Extended European Search Report mailed Jun. 16, 2010 in EP Appln. No. 06844144.3.

U.S. Appl. No. 11/418,079—Oct. 12, 2010 PTO Office Action.

U.S. Appl. No. 11/418,089—Oct. 1, 2010 PTO Office Action.

U.S. Appl. No. 11/418,096—Aug. 20, 2010 PTO Office Action.

U.S. Appl. No. 12/843,415—Oct. 13, 2010 PTO Office Action.

\* cited by examiner

INTEGRATION OF VACUUM MICROELECTRONIC DEVICE WITH INTEGRATED CIRCUIT

COPYRIGHT NOTICE

A portion of the disclosure of this patent document contains material which is subject to copyright or mask work protection. The copyright or mask work owner has no objection to the facsimile reproduction by anyone of the patent document or the patent disclosure, as it appears in the Patent and Trademark Office patent file or records, but otherwise reserves all copyright or mask work rights whatsoever.

CROSS-REFERENCE TO RELATED APPLICATIONS

The present invention is related to the following co-pending U.S. patent applications which are all commonly owned with the present application, the entire contents of each of which are incorporated herein by reference:
(1) U.S. patent application Ser. No. 11/238,991, filed Sep. 30, 2005, entitled "Ultra-Small Resonating Charged Particle Beam Modulator";
(2) U.S. patent application Ser. No. 10/917,511, filed on Aug. 13, 2004, entitled "Patterning Thin Metal Film by Dry Reactive Ion Etching";
(3) U.S. application Ser. No. 11/203,407, filed on Aug. 15, 2005, entitled "Method Of Patterning Ultra-Small Structures";
(4) U.S. application Ser. No. 11/243,476, filed on Oct. 5, 2005, entitled "Structures And Methods For Coupling Energy From An Electromagnetic Wave";
(5) U.S. application Ser. No. 11/243,477, filed on Oct. 5, 2005, entitled "Electron beam induced resonance,"
(6) U.S. application Ser. No. 11/325,448, entitled "Selectable Frequency Light Emitter from Single Metal Layer," filed Jan. 5, 2006 ;
(7) U.S. application Ser. No. 11/325,432, entitled, "Matrix Array Display," filed Jan. 5, 2006 ,
(8) U.S. application Ser. No. 11/410,905, entitled, "Coupling Light of Light Emitting Resonator to Waveguide," and filed Apr. 26, 2006 ;
(9) U.S. application Ser. No. 11/411,120, entitled "Free Space Interchip Communication," and filed Apr. 26, 2006 ;
(10) U.S. application Ser. No. 11/410,924, entitled, "Selectable Frequency EMR Emitter," filed Apr. 26, 2006 ;
(11) U.S. application Ser. No. 11/418,126, entitled, "Multiplexed Optical Communication between Chips on A Multi-Chip Module," and filed on even date herewith;
(12) U.S. patent application Ser. No. 11/400,280, titled "Micro Resonant Detector for Optical Signals on a Chip," filed Apr. 10, 2006; and
(13) U.S. patent application Ser. No. 11/418,078, entitled "Coupling energy in a plasmon wave to an electron beam," and filed on even date herewith.

FIELD OF THE DISCLOSURE

This relates to ultra-small electronic devices, and, more particularly, integrating such devices with integrated circuits.

INTRODUCTION

Integrated circuits (ICs) are ubiquitous. While it is desirable to add functionality (such as inter-chip optical communications) to existing ICs, this is typically done through external devices and connections.

Various ultra-small resonant structures have been described in the related applications to perform a variety of functions, including optical data transfer functions. These ultra-small resonant devices are functionally compatible with standard ICs.

It is desirable to integrate ultra-small resonant structures with ICs.

BRIEF DESCRIPTION OF THE DRAWINGS

The following description, given with respect to the attached drawings, may be better understood with reference to the non-limiting examples of the drawings, wherein.

THE PRESENTLY PREFERRED EXEMPLARY EMBODIMENTS

Figure 1:
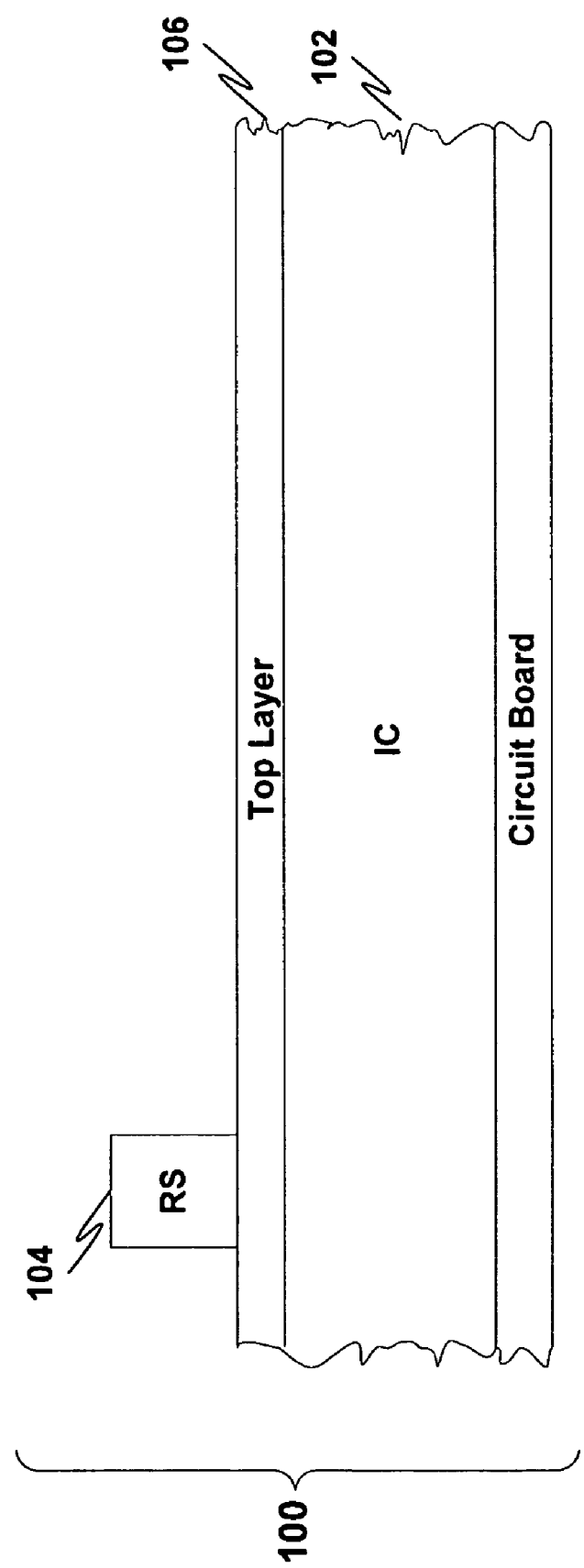
FIGS. 1, 2, 3A, 3B, and 4-7 show ICs integrated with ultra-small resonant structures.

FIG. 1 shows an integrated structure 100 in which IC 102 is integrated with an ultra-small resonant structure (RS) 104. The ultra-small resonant structure 104 can be formed on an external surface of the IC, e.g., on the top of the upper layer dielectric or polymer layer 106 of the IC 102. There is no need for the ultra-small resonant structure 104 to have any (direct or indirect) electrical connection to the IC 102, and it may operated independently of the IC 102.

Figure 2:
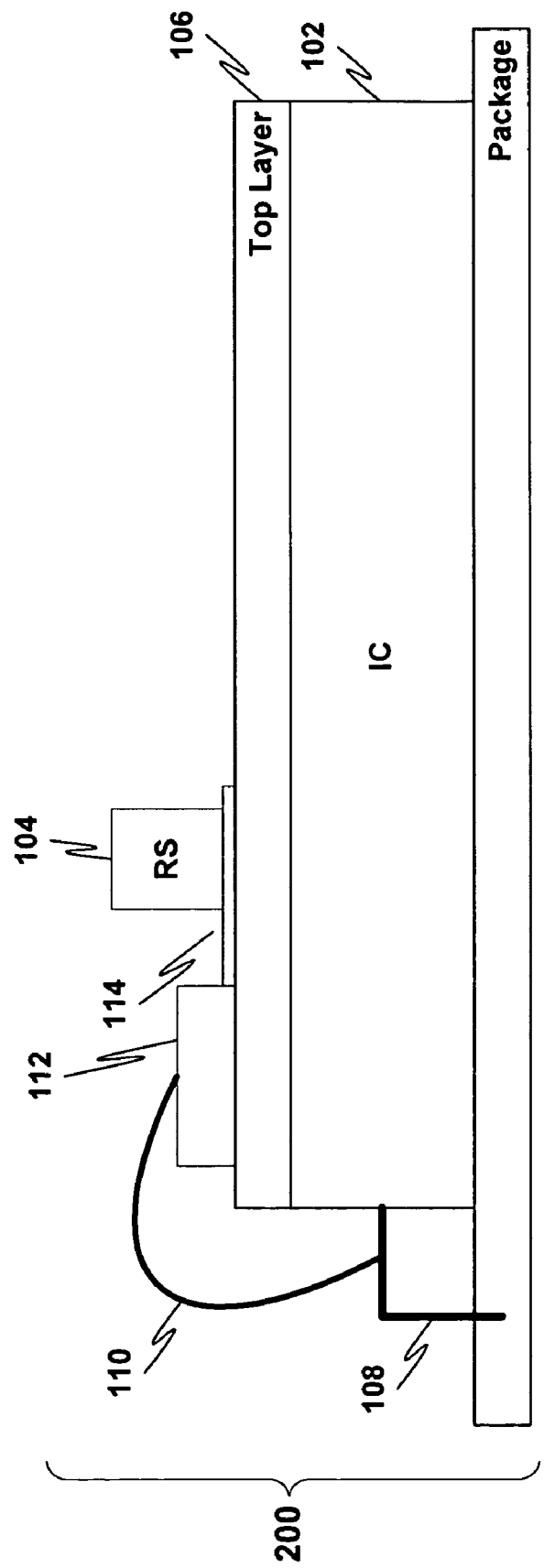

It may, however, be desirable to ground the ultra-small resonant structure 104 (or to connect it to some known potential). Grounding may be achieved, e.g., as shown in the integrated structure 200 in FIG. 2, by electrically connecting the ultra-small resonant structure 104 to an appropriate pin 108 that is used to connect the IC 102 to a circuit board or other surface. The electrical connection can be achieved, e.g., by providing an appropriately shaped grounded region 112, formed on the IC, and then electrically connecting the ultra-small resonant structure 104 to the grounded region 112 (e.g., using connection 114). Instead of grounding, the ultra-small resonant structure may be connected to a region of some known potential.

The grounded region 112 and connection 114 may be formed of a metal such as, e.g., silver (Ag), and the structure 104 may be formed directly on the metal.

Although only one ultra-small resonant structure 104 is shown in most examples in this description, those skilled in the art will realize, upon reading this description, that more than one ultra-small resonant structure may be formed on an IC.

The IC may be any IC formed, e.g., with conventional semiconductor processing. The ultra-small resonant structure(s) may be any ultra-small resonant structure(s). Exemplary ultra-small resonant structures are described in the various related applications which have been incorporated herein by reference.

The ultra-small resonant structures may be made, e.g., using techniques such as described in U.S. patent application Ser. No. 10/917,511, entitled "Patterning Thin Metal Film by Dry Reactive Ion Etching" and/or U.S. application Ser. No. 11/203,407, entitled "Method Of Patterning Ultra-Small Structures," both of which have been incorporated herein by reference.

The ultra-small resonant structure may comprise any number of resonant microstructures constructed and adapted to produce EMR, e.g., as described above and/or in U.S. application Ser. No. 11/325,448, entitled "Selectable Frequency Light Emitter from Single Metal Layer," filed Jan. 5, 2006, U.S. application Ser. No. 11/325,432, entitled, "Matrix Array Display," filed Jan. 5, 2006, and U.S. application Ser. No. 11/243,476, filed on Oct. 5, 2005, entitled "Structures And Methods For Coupling Energy From An Electromagnetic Wave"; U.S. application Ser. No. 11/243,477, filed on Oct. 5, 2005, entitled "Electron beam induced resonance;" and U.S. application Ser. No. 11/302,471, entitled "Coupled Nano-Resonating Energy Emitting Structures," filed Dec. 14, 2005; and U.S. patent application Ser. No. 11/400,280, titled "Micro Resonant Detector for Optical Signals on a Chip," filed Apr. 10, 2006; and U.S. patent application Ser. No. 11/418,078, entitled "Coupling energy in a plasmon wave to an electron beam," filed on even date herewith.

The ultra-small resonant structures may emit light (such as infrared light, visible light or ultraviolet light or any other electromagnetic radiation (EMR) at a wide range of frequencies, and often at a frequency higher than that of microwave). The EMR is emitted when the resonant structure is exposed to a beam of charged particles ejected from or emitted by a source of charged particles. The source may be controlled by applying a signal on data input. The source can be any desired source of charged particles such as an ion gun, a Thermionic filament, tungsten filament, a cathode, a vacuum triode, a planar vacuum triode, an electron-impact ionizer, a laser ionizer, a field emission cathode, a chemical ionizer, a thermal ionizer, an ion-impact ionizer, an electron source from a scanning electron microscope, etc. The particles may be positive ions, negative ions, electrons, and protons and the like.

Figure 3A:
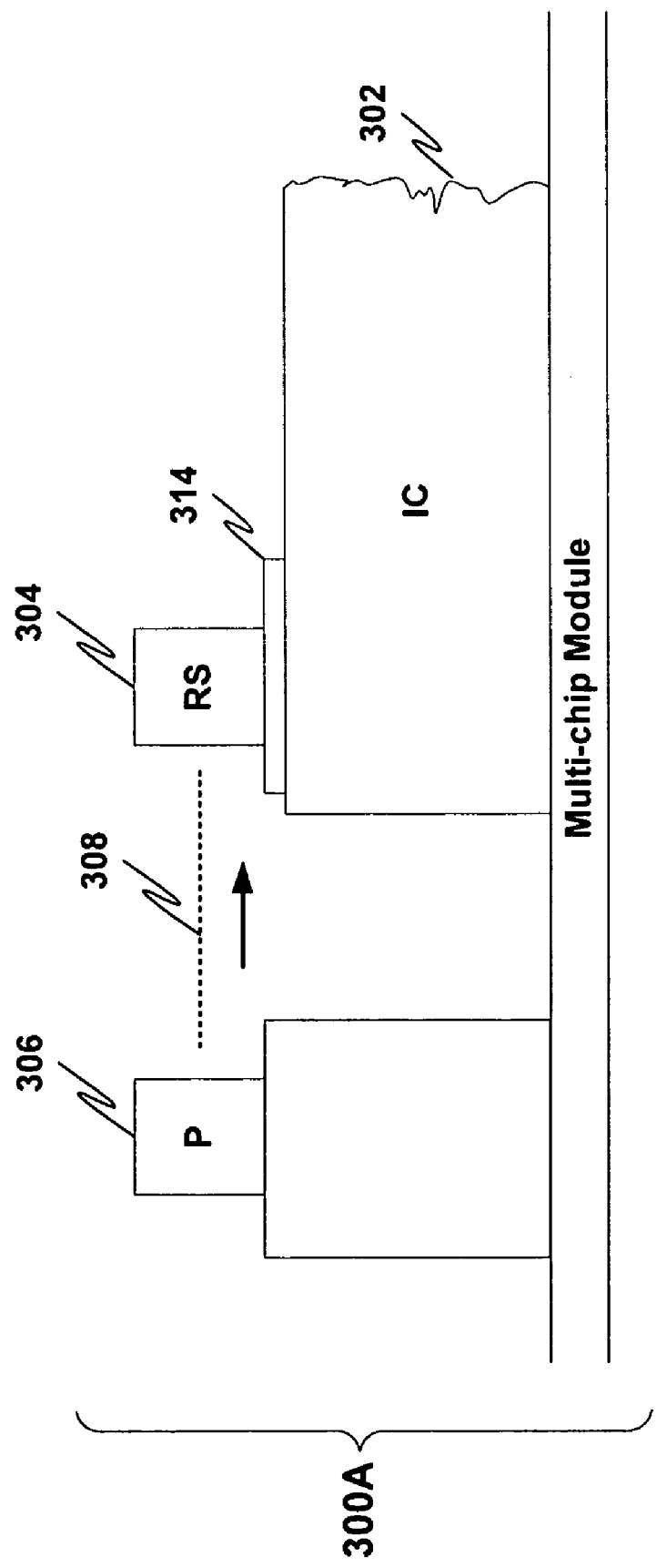

FIG. 3A is a side view of a system 300A which includes ultra-small resonant structures 304 formed on a grounded region 314 on a (top) surface of an IC 302. One or more sources of charged particles 306 are positioned so that the emitted beam(s) of particles 308 cause the structures 304 to resonate.

Figure 3B:
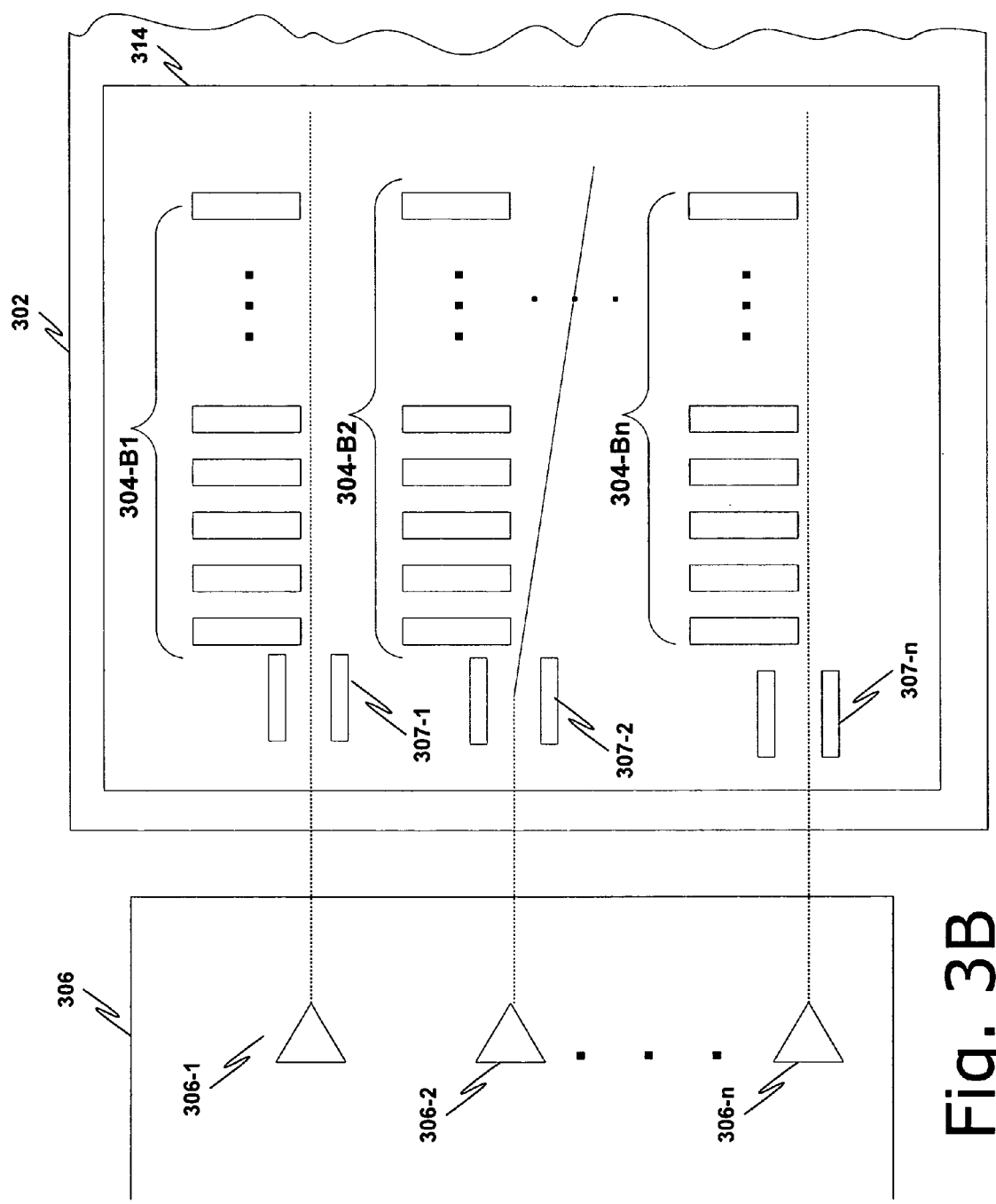

FIG. 3B is a top view of an exemplary system as shown in FIG. 3A. As shown in FIG. 3B, the structures 304 comprise a plurality of arrays of structures 304-B1, 304-B2, . . . , 304-Bn, formed on the grounded region 314. Corresponding charged particle emitters 306-1, 306-2, . . . , 306-n are formed on a different surface, perhaps on an IC. Each particle emitter 306-k emits a beam of charged particles to a corresponding array of ultra-small resonant structures 304-Bk. A deflector mechanism 307-k may be associated with some or all of the particle emitters 306-k to control the direction of the emitted beam. Control of the deflectors is not shown. For example, the beam emitted by particle emitter 306-2 has been deflected by emitter(s) 307-2.

Those skilled in the art will understand, upon reading this disclosure, that some or all of the deflector(s) may be formed on the same surface as the resonant structures.

Figure 4:
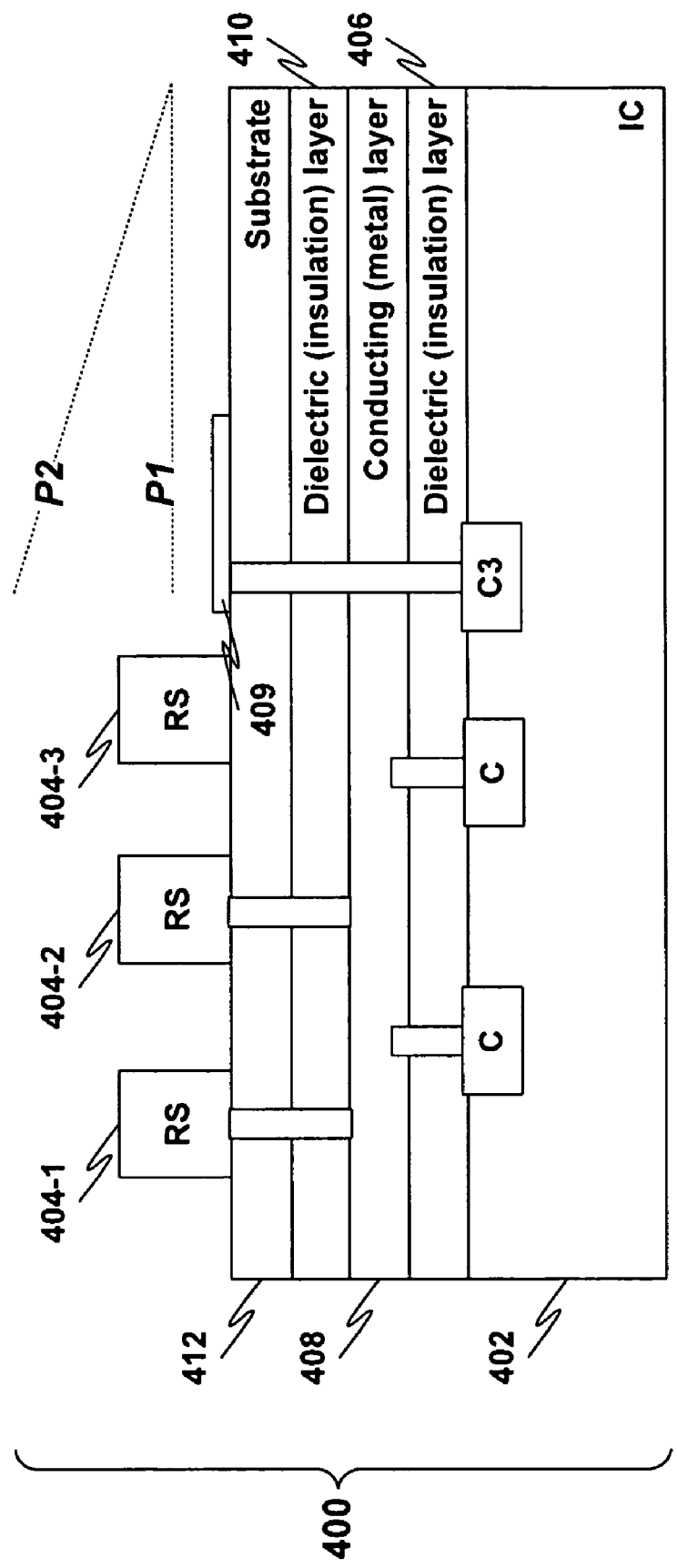

In some cases it is desirable to have an ultra-small resonant structure electrically connect with the underlying IC. For example, FIG. 4 shows an integrated structure 400 in which IC 402 is integrated with various ultra-small resonant structures 404-1, 404-2, 404-3 (collectively ultra-small resonant structures 404). While FIG. 4 shows three ultra-small resonant structures, those skilled in the art will immediately understand upon review of this disclosure that the number of ultra-small resonant structures will vary by their function and application, and that more or less than three may be used.

Preferably a dielectric (insulation) layer 406 is formed on a surface of IC 402. A conducting (metal) layer 408, (e.g., silver or copper) is formed on the dielectric layer 406, and a second dielectric layer 410 is formed on the conducting layer 408. Another substrate layer 412 may then be formed on the second dielectric layer 410.

The first and second dielectric layers 406, 410 may be formed using, e.g., $SiO_2$. The metal layer 408 may be formed using gold (Au), copper (Cu), aluminum (Al), tungsten (W) or the like.

Typically the conducting/metal layer 408 does not cover the entire dielectric layer below it. Those skilled in the art will understand, upon review of this disclosure, that the conducting/metal layer 408 covers a sufficient portion or portions of the first dielectric layer 406 to enable appropriate electrical contact(s) between one or more of the ultra-small resonant structures 404 and the IC 402.

The ultra-small resonant structures 404 may then be formed on the substrate 412.

One or more of the ultra-small resonant structures communicates with the IC 402 through contact vias formed in the insulation layers. As shown in the drawing, two of the ultra-small resonant structures connect to two contact locations (denoted C).

FIG. 4 also shows a deflection mechanism (plate 409) coupled to the IC at C3. The plate 409 may be used to control a beam of charged particles, causing the beam to travel along path P1 (when not deflected) or path P2 (when deflected). In this manner, the interaction of the beam of charged particles with the various resonant structures, e.g., with resonant structure 404-3, may be controlled by the IC. (The source of the beam of charged particles is not shown.)

Since the ultra-small resonant structures can be formed at temperatures of less than 120° C., the process of integrating an IC with ultra-small resonant structures will not damage the IC.

Figure 5:
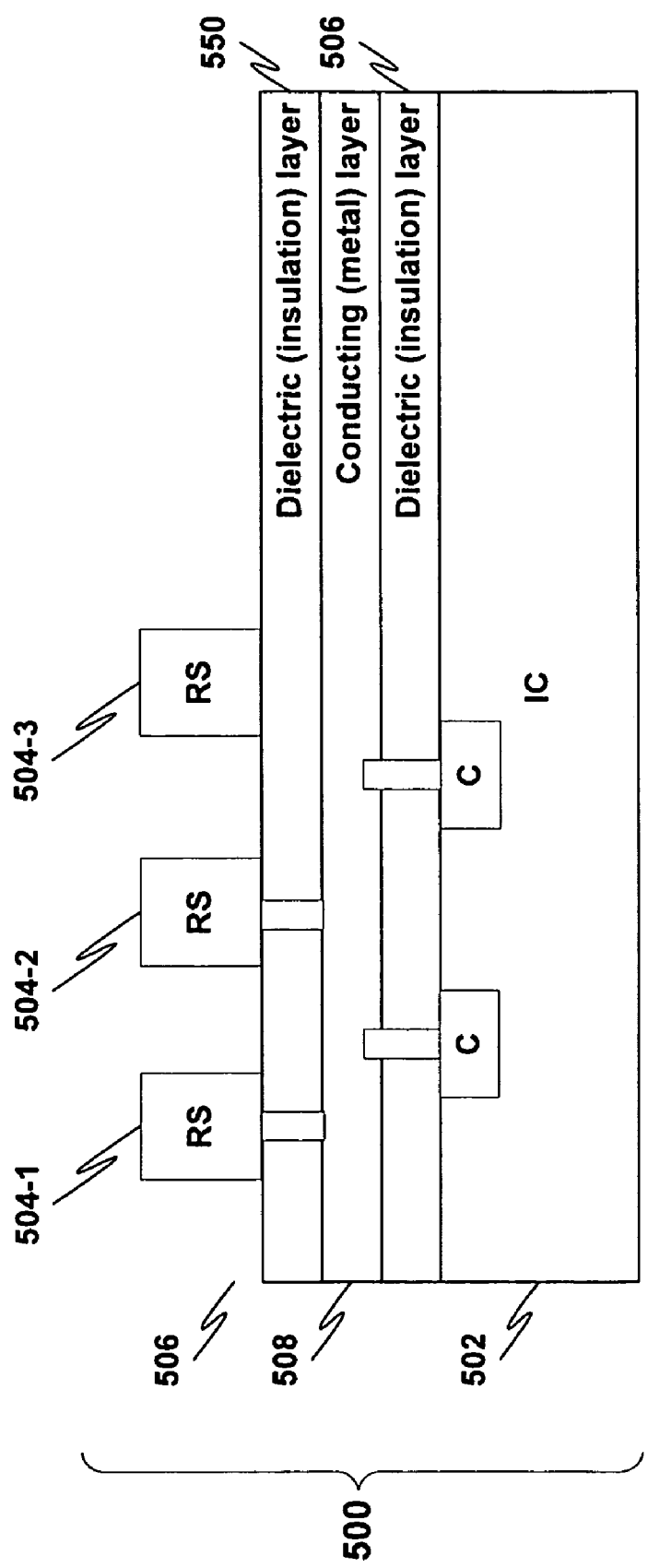

FIG. 5 shows an exemplary circuit 500 without a substrate layer, and in which the ultra-small resonant structures are formed directly on the second dielectric layer 550.

Figure 6:
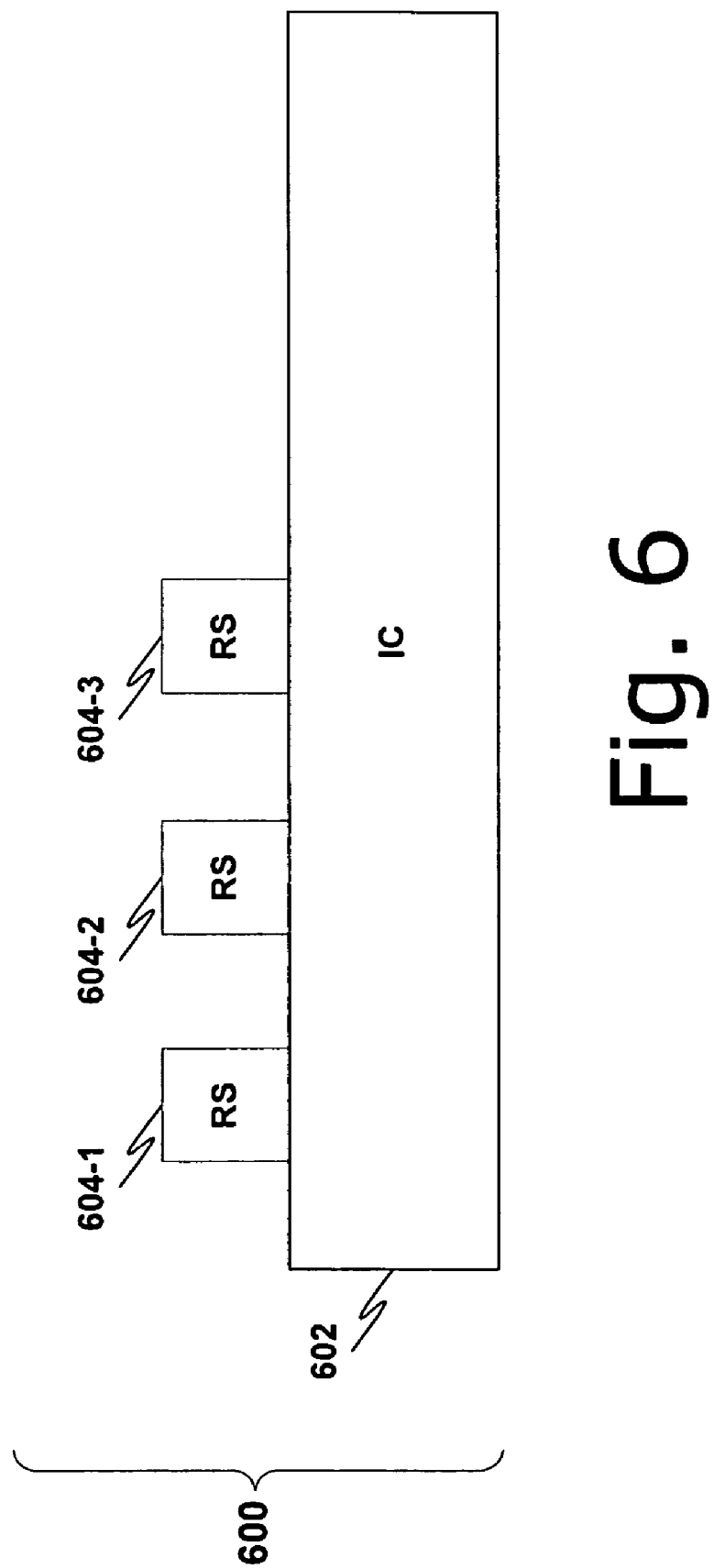

In some cases, as shown, e.g., in the circuit 600 in FIG. 6, the ultra-small resonant structures are formed directly on a surface of the IC 602.

Figure 7:
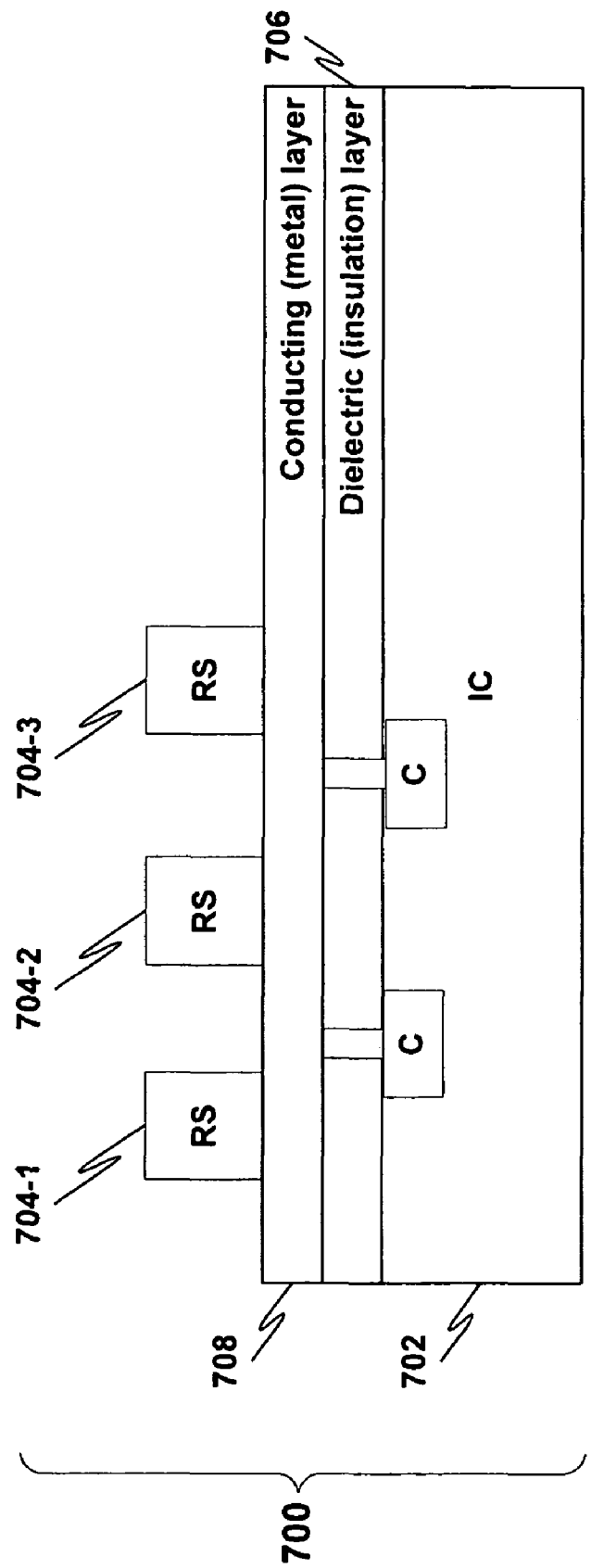

FIG. 7 shows an exemplary circuit 700 in which the ultra-small resonant structures 704 are formed directly on the conducting (metal) layer 708. In this case the ultra-small resonant structure should not include a source of charged particles. The source of charged particles for each ultra-small resonant structure should, instead, be located off-chip.

All of the ultra-small resonant structures described are preferably under vacuum conditions during operation. Accordingly, in each of the exemplary embodiments described herein, the entire integrated package/circuit (which includes the IC and ultra-small resonant structures) may be vacuum packaged. Alternatively, the portion of the package containing at least the ultra-small resonant structure(s) should be vacuum packaged. Our invention does not require any particular kind of evacuation structure. Many known hermetic sealing techniques can be employed to ensure the vacuum condition remains during a reasonable lifespan of operation. We anticipate that the devices can be operated in a pressure up to atmospheric pressure if the mean free path of the electrons is longer than the device length at the operating pressure.

While certain configurations of structures have been illustrated for the purposes of presenting the basic structures of the present invention, one of ordinary skill in the art will appreciate that other variations are possible which would still fall within the scope of the appended claims. While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

I claim:
1. A method making a device comprising:
obtaining an integrated circuit (IC);
forming an ultra-small resonant structure on an external surface of the IC, wherein said ultra-small resonant structure is constructed and adapted to emit electromagnetic radiation (EMR) in response to excitation by a beam of charged particles; and
vacuum packaging at least said ultra-small resonant structure.

2. A method as in claim 1 further comprising:
electrically grounding said ultra-small resonant structure.

3. A method as in claim 2 further comprising:
forming a region on said IC;
grounding said region; and
electrically connecting said ultra-small resonant structure to said region.

4. A method as in claim 3 wherein said region is grounded by being electrically connected to a connection pin of said IC.

5. A method as in claim 2 wherein said ultra-small resonant structure is electrically grounded by electrically connecting said ultra-small resonant structure to a connection pin of said IC.

6. A method as in claim 1 further comprising:
electrically connecting said ultra-small resonant structure to a known electrical potential.

7. A method as in claim 6 further comprising:
forming a region on said IC;
electrically connecting said region to a known electrical potential; and
electrically connecting said ultra-small resonant structure to said region.

8. A method as in claim 7 wherein said region is set to said known electrical potential by being electrically connected to a connection pin of said IC.

9. A method as in claim 6 wherein said ultra-small resonant structure is electrically connected to a connection pin of said IC to provide the known electrical potential.

10. A method as in claim 1 wherein said step of vacuum packaging comprises:
hermetically sealing at least said ultra-small resonant structure.

11. A method as in any one of claims 1-10 wherein the beam is emitted by a source of charged particles.

12. A method as in claim 11 wherein said source of charged particles is selected from the group comprising:
an ion gun, a thermionic filament, tungsten filament, a cathode, a vacuum triode, a field emission cathode, a planar vacuum triode, an electron-impact ionizer, a laser ionizer, a chemical ionizer, a thermal ionizer, an ion-impact ionizer.

13. A method as in claim 11 wherein the charged particles are selected from the group comprising: positive ions, negative ions, electrons, and protons.

14. A method as in claim 1 wherein the ultra-small resonant structure is constructed and adapted to emit at least one of visible light, infrared light, and ultraviolet light.

15. A method as in claim 1 further comprising:
electrically connecting said ultra-small resonant structure to said IC.

16. A method of making a device comprising:
forming at least one ultra-small resonant structure on an external surface of an integrated circuit (IC), wherein said ultra-small resonant structure is constructed and adapted to emit electromagnetic radiation (EMR) in response to excitation by a beam of charged particles; and
vacuum packaging at least said at least one ultra-small resonant structure.

17. A device comprising:
an integrated circuit (IC); and
at least one ultra-small resonant structure formed on an external surface of said IC), wherein said ultra-small resonant structure is constructed and adapted to emit electromagnetic radiation (EMR) in response to excitation by a beam of charged particles.

18. A device as in claim 17 wherein said at least one ultra-small resonant structure is vacuum packaged.

19. A device as in claim 17 wherein said at least one ultra-small resonant structure is electrically grounded.

20. A device as in claim 17 wherein said at least on ultra-small resonant structure is electrically connected to a known electrical potential.

21. A device as in claim 17 further comprising:
at least one electrically grounded region formed on said IC, wherein said at least one ultra-small resonant structure is electrically grounded by being connected to said least one region.

22. A device as in claim 17 further comprising:
at least one region formed on said IC, said at least one region being electrically connected to a known electrical potential, wherein said at least one ultra-small resonant structure is electrically connected to said least one region.

23. A device as in claim 17 wherein at least one of said at least one ultra-small resonant structure is electrically connected to said IC.

24. A device as in claim 17 further comprising:
a deflector electrically connected to said IC and constructed and adapted to control said EMR emitted by said at least one ultra-small resonant structure.

25. A device as in claim 24 wherein said deflector comprises:
one or more deflector plates.

26. A device as in claim 25 wherein said deflector plates are formed on the same external surface of the IC as the at least one resonant structure.

27. A device as in claim 25 wherein said deflector controls said EMR by selectively deflecting said beam of charged particles.

28. A device as in claim 17 wherein the beam is emitted by a source of charged particles.

29. A device as in claim 28 wherein said source of charged particles is selected from the group comprising:
an ion gun, a tungsten filament, a cathode, a planar vacuum triode, an electron-impact ionizer, a laser ionizer, a chemical ionizer, a thermal ionizer, and an ion-impact ionizer.

30. A device as in claim 28 wherein the charged particles are selected from the group comprising: positive ions, negative ions, electrons, and protons.

31. A method of making a circuit comprising:
obtaining an integrated circuit (IC);
forming at least one ultra-small resonant structure, wherein said at least one ultra-small resonant structure is electrically connected to said IC and is constructed and adapted to emit electromagnetic radiation (EMR) in response to excitation by a beam of charged particles; and
vacuum packaging said circuit.

32. A method as in claim 31 further comprising:
forming a first dielectric layer on a surface of said IC;
forming an interconnect layer on said first dielectric layer; and
forming a second dielectric layer on said interconnect layer, wherein said at least one ultra-small resonant structure is formed on said second dielectric layer.

33. A method as in claim 32 further comprising:
forming at least one contact via in said second dielectric layer to allow electrical connection of an ultra-small resonant structure on said substrate to said interconnect layer, and
forming a second contact via in said first dielectric layer to allow electrical connection of said IC to said interconnect layer,
wherein said at least one ultra-small resonant structure is electrically connected to said IC via said first contact via, said interconnect layer and said second contact via.

34. A method as in claim 32 wherein said first dielectric layer comprises $SiO_2$.

35. A method as in claim 32 wherein said second dielectric layer comprises $SiO_2$.

36. A method as in claim 32 wherein said interconnect layer comprises a metal selected from the group comprising: gold (Au), copper (Cu), aluminum (Al) and tungsten (W).

37. A method as in claim 31 wherein said at least one ultra-small resonant structure is formed on a surface of said IC.

38. A method as in claim 31 further comprising:
forming a first dielectric layer on a surface of said IC;
forming an interconnect layer on said first dielectric layer; wherein said at least one ultra-small resonant structure is formed on said interconnect layer.

39. A method as in any one of claims 31-37 wherein the beam is emitted by a source of charged particles.

40. A method as in claim 39 wherein said source of charged particles is selected from the group comprising: an ion gun, a tungsten filament, a cathode, a planar vacuum triode, an electron-impact ionizer, a laser ionizer, a chemical ionizer, a thermal ionizer, and an ion-impact ionizer.

41. A method as in claim 39 wherein the charged particles are selected from the group comprising: positive ions, negative ions, electrons, and protons.

42. A method as in any one of claims 31-37 wherein the at least on ultra-small resonant structure is constructed and adapted to emit at least one of visible light, infrared light, and ultraviolet light.

43. A circuit comprising:
an integrated circuit (IC); and
at least one ultra-small resonant structure electrically connected to said IC, wherein said at least one ultra-small resonant structure is constructed and adapted to emit electromagnetic radiation (EMR) in response to excitation by a beam of charged particles and wherein said IC and said at least one ultra-small resonant structure are vacuum packaged.

44. A circuit as in claim 43 wherein said at least one ultra-small resonant structure is formed on a surface of said IC.

45. A circuit as in claim 43 further comprising:
a first dielectric layer formed on a surface of said IC;
an interconnect layer on said first dielectric layer; and
a second dielectric layer on said interconnect layer, wherein said at least one ultra-small resonant structure is formed on said second dielectric layer.

46. A circuit as in claim 43 further comprising:
a first dielectric layer on a surface of said IC;
an interconnect layer on said first dielectric layer; wherein said at least one ultra-small resonant structure is formed on said interconnect layer.

* * * * *